(12) United States Patent
Chang et al.

(10) Patent No.: US 9,633,727 B2
(45) Date of Patent: Apr. 25, 2017

(54) RESISTIVE MEMORY DEVICES AND METHODS OF CONTROLLING RESISTIVE MEMORY DEVICES ACCORDING TO SELECTED PULSE POWER SPECIFICATIONS

(71) Applicant: Samsung Electronics Co., Ltd., Suwon-si, Gyeonggi-do (KR)

(72) Inventors: Man Chang, Hwaseong-si (KR); In-gyu Baek, Seoul (KR); Sang-heon Lee, Pohang-si (KR); Hyun-sang Hwang, Pohang-si (KR)

(73) Assignees: SAMSUNG ELECTRONICS CO., LTD., Gyeonggi-Do (KR); POSTECH ACADEMY-INDUSTRY FOUNDATION, Gyeongsangbuk-Do (KR)

( * ) Notice: Subject to any disclaimer, the term of this patent is extended or adjusted under 35 U.S.C. 154(b) by 0 days.

(21) Appl. No.: 14/830,377

(22) Filed: Aug. 19, 2015

(65) Prior Publication Data
US 2016/0155500 A1 Jun. 2, 2016

(30) Foreign Application Priority Data
Nov. 28, 2014 (KR) ........................ 10-2014-0169181

(51) Int. Cl.
*G11C 11/00* (2006.01)
*G11C 13/00* (2006.01)
*G11C 11/56* (2006.01)

(52) U.S. Cl.
CPC ...... *G11C 13/0069* (2013.01); *G11C 11/5678* (2013.01); *G11C 11/5685* (2013.01); *G11C 13/0064* (2013.01); *G11C 2013/0092* (2013.01)

(58) Field of Classification Search
CPC ............ G11C 13/0069; G11C 11/5685; G11C 11/5678; G11C 13/0064; G11C 2013/0092
USPC .......................... 365/148, 226, 227, 228, 229
See application file for complete search history.

(56) References Cited

U.S. PATENT DOCUMENTS

| | | | |
|---|---|---|---|
| 7,218,300 B2 * | 5/2007 | Shimizu ............... | G09G 3/3648 345/204 |
| 7,778,066 B2 | 8/2010 | Horii et al. | |
| 8,149,609 B2 | 4/2012 | Nagashima | |
| 2009/0052235 A1 * | 2/2009 | Horii ................... | G11C 11/5678 365/163 |
| 2009/0154222 A1 | 6/2009 | Chien et al. | |
| 2012/0236624 A1 | 9/2012 | Costa et al. | |
| 2012/0294064 A1 | 11/2012 | Kitagawa et al. | |
| 2014/0054536 A1 | 2/2014 | Lee | |
| 2014/0063898 A1 | 3/2014 | Fantini et al. | |

(Continued)

FOREIGN PATENT DOCUMENTS

KR  10-1311499 B1  9/2013

*Primary Examiner* — Tha-O H Bui
(74) *Attorney, Agent, or Firm* — Harness, Dickey & Pierce PLC

(57) ABSTRACT

A method of controlling a resistive memory device includes: accessing a first pulse power specification satisfying a memory cell coefficient associated with at least a first of a plurality of memory cells included in a memory cell array; generating a first pulse power according to the accessed first pulse power specification; and performing a write operation on at least the first of the plurality of memory cells using the generated first pulse power.

20 Claims, 17 Drawing Sheets

(56) References Cited

U.S. PATENT DOCUMENTS

2014/0169063 A1 6/2014 August et al.
2014/0241035 A1 8/2014 Siau

* cited by examiner

RESISTIVE MEMORY DEVICES AND METHODS OF CONTROLLING RESISTIVE MEMORY DEVICES ACCORDING TO SELECTED PULSE POWER SPECIFICATIONS

CROSS-REFERENCE TO RELATED APPLICATION(S)

This application claims priority under 35 U.S.C. §119 to Korean Patent Application No. 10-2014-0169181, filed on Nov. 28, 2014, in the Korean Intellectual Property Office, the disclosure of which is incorporated herein in its entirety by reference.

BACKGROUND

Field

One or more example embodiments of inventive concepts relate to resistive memory devices and methods of controlling the same.

Description of Related Art

With the demand for higher capacity and lower power consumption memory devices, research into next-generation memory devices that are non-volatile and do not require a refresh operation is being conducted. The next-generation memory devices are required to have the relatively high integration characteristics of a Dynamic Random Access Memory (DRAM), non-volatile characteristics of a flash memory, and the relatively high speed of a static RAM (SRAM). In some cases, Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) are being highlighted as next-generation memory devices.

SUMMARY

One or more example embodiments of inventive concepts relate to resistive memory devices in which write operations are performed using changes in resistance of memory cells. One or more example embodiments relate to methods of controlling resistive memory devices in which write operations are performed using changes in resistance of memory cells.

One or more example embodiments provide methods of controlling resistive memory devices, in which degradation in reliability due to a relatively high degree of integration of a memory device may be suppressed and/or prevented, and in which a more stable write operation may be performed.

At least one example embodiment provides a method of controlling a resistive memory device, the method including: accessing a first pulse power specification satisfying a memory cell coefficient associated with at least a first of a plurality of memory cells included in a memory cell array; generating a first pulse power according to the accessed first pulse power specification; and performing a write operation on at least the first of the plurality of memory cells using the generated first pulse power.

According to at least some example embodiments, the method may further include: monitoring a result of the write operation; accessing a second pulse power specification satisfying the memory cell coefficient based on a result of the monitoring; and generating a second pulse power according to the accessed second pulse power specification, the generated second pulse power having a different voltage level and a different pulse width relative to the generated first pulse power.

The memory cell coefficient may have a value based on at least one of a material and a structure of the plurality of memory cells.

According to at least some example embodiments, the method may further include setting at least one of a voltage level and a pulse width of the generated first pulse power according to the accessed first pulse power specification.

The memory cell coefficient may satisfy the equation $(V-V_{os})^2 \times PW = C$, where V denotes a voltage level of the generated first pulse power, $V_{os}$ denotes an offset voltage level, PW denotes a pulse width of the generated first pulse power, and C denotes the memory cell coefficient.

The performing the write operation may include applying the generated first pulse power having the set voltage level and the set pulse width to each of the plurality of memory cells to perform the same write operation on each of the plurality of memory cells.

The set voltage level of the generated first pulse power may be greater than the offset voltage level.

According to at least some example embodiments, if the set voltage level of the generated first pulse power is a maximum possible voltage level, then the setting of the pulse width of the first pulse power may include determining a pulse width satisfying the memory cell coefficient based on the maximum possible voltage level.

If the set pulse width of the generated first pulse power is a maximum possible pulse width, then the setting of the voltage level of the first pulse power may include determining a voltage level satisfying the memory cell coefficient based on the maximum possible pulse width.

A second of the plurality of memory cells may have a different memory cell coefficient relative to the first of the plurality of memory cells, and the performing the write operation may include performing the write operation on the first of the plurality of memory cells and the second of the plurality of memory cells by using pulse powers corresponding to different memory cell coefficients.

According to at least some example embodiments, the method may further include storing, in the resistive memory device, a plurality of pulse power specifications satisfying the memory cell coefficient, which is calculated by performing a test operation.

The write operation may be a set write operation in which a resistance state of at least the first of the plurality of memory cells is reduced.

At least one other example embodiment provides a method of controlling a resistive memory device, the method including: setting a voltage level and a pulse width of a pulse power such that the pulse power satisfies a memory cell coefficient, the memory cell coefficient being based on characteristics of a plurality of memory cells of a memory cell array; generating the pulse power having the set voltage level and the set pulse width in response to a write command; and performing a write operation on the plurality of memory cells by using the generated pulse power, the write operation corresponding to the write command.

According to at least some example embodiments, the plurality of memory cells may be multilevel cells, and the method may further include: receiving information indicating which of a plurality of write operations is to be performed on the multilevel cells; and accessing the memory cell coefficient from among a plurality of memory cell coefficients associated with the multilevel cells, the memory cell coefficient being associated with the write operation corresponding to the received information.

The method may further include: storing a plurality of pulse power specifications satisfying the memory cell coefficient in the resistive memory device; and wherein the set voltage level and the set pulse width of the pulse power are set according to a pulse power specification selected from among the plurality of pulse power specifications.

At least one other example embodiment provides a method of programming at least one memory cell of a resistive memory device, the method including: selecting a first pulse power specification from among a plurality of pulse power specifications based on a memory cell coefficient for the at least one memory cell, each of the plurality of pulse power specifications corresponding to a write operation for the at least one memory cell; setting a voltage level and a pulse width for performing the write operation on the at least one memory cell based the selected first pulse power specification; and performing the write operation on the at least one memory cell using the set voltage level and pulse width.

According to at least some example embodiments, the method may further include: detecting a failure of the write operation; selecting a second pulse power specification from among the plurality of pulse power specifications corresponding to the write operation; re-setting the voltage level and the pulse width for performing the write operation on the at least one memory cell based the selected second pulse power specification; and re-performing the write operation using the re-set voltage level and pulse width.

The at least one memory cell may be a multilevel cell having a plurality of resistance states, each of the plurality of resistance states having an associated memory cell coefficient; and the selecting may select the first pulse power specification based on the memory cell coefficient associated with a resistance state, from among the plurality of resistance states, corresponding to the write operation.

Each of the plurality of pulse width specifications may satisfy the memory cell coefficient.

The selecting may select the first pulse power specification based on one of a maximum voltage level and a maximum pulse width capability of the resistive memory device.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
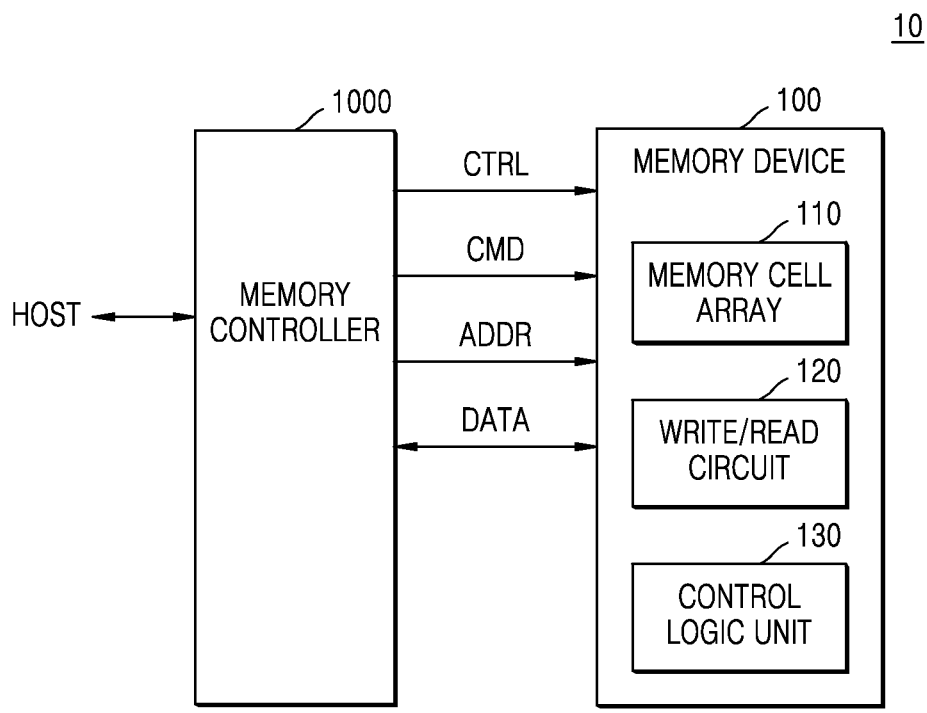
FIG. 1 is a block diagram illustrating a memory system including a resistive memory device according to an example embodiment of inventive concepts.

As used herein, the term "and/or" includes any and all combinations of one or more of the associated listed items. Expressions such as "at least one of," when preceding a list of elements, modify the entire list of elements and do not modify the individual elements of the list.

Hereinafter, inventive concepts will be described more fully with reference to the accompanying drawings, in which some example embodiments are shown. In the drawings, like elements are labeled like reference numerals and repeated description thereof will be omitted. This inventive concept may, however, be embodied in many different forms and should not be construed as limited to the example embodiments set forth herein. Rather, these embodiments are provided so that this disclosure will be thorough and complete, and will fully convey the scope of the invention to those of ordinary skill in the art.

In the present description, terms such as 'first', 'second', etc. are used to describe various members, areas, layers, regions, and/or components. However, it is obvious that the members, areas, layers, regions, and/or components should not be defined by these terms. The terms should not be construed as indicating any particular order, the upper or lower position, or superiority or inferiority, and are used only for distinguishing one member, area, layer, region, or component from another member, area, layer, region, or component. Thus, a first member, area, layer, region, or component which will be described may also refer to a second member, area, layer, region, or component, without departing from the teaching of the inventive concept. For example, without departing from the scope of inventive concepts, a first component may be referred to as a second component, and similarly, a second component may be referred to as a first component.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

When an embodiment is implementable in another manner, a given (or alternatively, desired or predetermined) process order may be different from a described one. For example, two processes that are consecutively described may be substantially simultaneously or concurrently performed, or may be performed in an order opposite to the described order.

In the drawings, for example, according to the manufacturing techniques and/or tolerances, shapes of the illustrated elements may be modified. Thus, inventive concepts should not be construed as being limited to the example embodiments set forth herein, and should include, for example, variations in the shapes caused during manufacturing.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments may be described with reference to acts and symbolic representations of operations (e.g., in the form of flow charts, flow diagrams, data flow diagrams, structure diagrams, block diagrams, etc.) that may be implemented as program modules or functional processes including routines, programs, objects, components, data structures, etc., that perform particular tasks or implement particular abstract data types. The operations may be implemented using existing hardware in existing memory devices or systems. Such existing hardware may include one or more Central Processing Units (CPUs), digital signal processors (DSPs), application-specific-integrated-circuits (ASICs), SoCs, field programmable gate arrays (FPGAs), computers, or the like.

Further, one or more example embodiments may be (or include) hardware, firmware, hardware executing software, or any combination thereof. Such hardware may include one or more CPUs, SoCs, DSPs, ASICs, FPGAs, computers, or the like, configured as special purpose machines to perform the functions described herein as well as any other well-known functions of these elements. In at least some cases, CPUs, SoCs, DSPs, ASICs and FPGAs may generally be referred to as processing circuits, processors and/or microprocessors.

Although a flow chart may describe operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium," may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, at least some portions of example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, processor(s), processing circuit(s), or processing unit(s) may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

FIG. 1 is a block diagram illustrating a memory system 10 including a resistive memory device 100 according to an example embodiment of inventive concepts.

Referring to FIG. 1, the memory system 10 may include the resistive memory device 100 (hereinafter referred to as a memory device 100) and a memory controller 1000. The memory device 100 may include a memory cell array 110, a write/read circuit 120, and a control logic unit 130. If the memory cell array 110 includes resistive memory cells, then the memory system 10 may be referred to as a resistive memory system.

In response to a write/read request from a host, the memory controller 1000 may read data stored in the memory device 100, or may control the memory device 100 to write data to the memory device 100. In more detail, for example, the memory controller 1000 may provide an address ADDR, a command CMD, and a control signal CTRL to the memory device 100, and thus, may control a program (or write) operation and a read operation with respect to the memory device 100. Also, write-target data DATA and read data DATA may be transmitted or received between the memory controller 1000 and the memory device 100.

Although not illustrated, the memory controller 1000 may include a Random Access Memory (RAM), a processing unit, a host interface, and a memory interface. The RAM may be used as an operation memory of the processing unit. The processing unit may control operations of the memory controller 1000. The host interface may include a protocol for exchanging data between the host and the memory controller 1000. For example, the memory controller 1000 may communicate with an external source, such as the host, by using at least one of various interface protocols including USB, MMC, PCI-E, Advanced Technology Attachment (ATA), Serial-ATA, Parallel-ATA, SCSI, ESDI, and Integrated Drive Electronics (IDE).

The memory cell array 110 may include a plurality of memory cells (not shown) that are disposed respectively in regions where a plurality of first signal lines and a plurality of second signal lines cross each other. According to at least one example embodiment, the plurality of first signal lines may be a plurality of bit lines, and the plurality of second signal lines may be a plurality of word lines. According to at least one other example embodiment, the first signal lines may be word lines, and the second signal lines may be bit lines.

According to at least this example embodiment, each of the memory cells may be a single level cell (SLC) that stores one bit data, or may be a multilevel cell (MLC) that may store at least two-bit data. Alternatively, the memory cell array 110 may include both SLCs and MLCs. When one bit data is written to one memory cell, the memory cells may have two resistance level distributions according to the written data. Alternatively, when two-bit data is written to one memory cell, the memory cells may have four resistance level distributions according to the written data. In at least one other example embodiment, if a memory cell is a triple level cell (TLC) that stores three-bit data, then the memory cells may have eight resistance level distributions according to the written data. However, inventive concepts are not limited to only these example embodiments. Rather, according to at least some other example embodiments, each of the memory cells may store at least four-bit data.

According to at least one example embodiment, the memory cell array 110 may include memory cells with a two-dimensional horizontal structure. According to yet at least one other example embodiment, the memory cell array 110 may include memory cells with a three-dimensional vertical structure, including a three-dimensional memory array.

Returning to FIG. 1, the memory cell array 110 may include resistive memory cells having a variable resistor device (not shown). In one example, the memory device may be a Phase-change RAM (PRAM) in which the variable resistor device is formed of a phase change material (e.g., Ge—Sb—Te), which has a phase that changes according to temperature. In another example, the resistive memory device may be a Resistive RAM (RRAM) in which the variable resistor device is formed of complex metal oxide including a top electrode, a bottom electrode, and a transition metal oxide therebetween. In yet another example, the resistive memory device may be a Magnetic RAM (MRAM) in which the variable resistor device has a top electrode formed of a magnetic material, a bottom electrode formed of the magnetic material, and a dielectric therebetween.

In at least some example embodiments, the memory cell array 110 may have a three-dimensional structure in which multiple layers are stacked. At least some of the multiple layers included in the memory cell array 110 may include a cell region in which memory cells are disposed. Also, others of the multiple layers may correspond to a control layer in which peripheral circuits to perform a memory operation on a cell region are disposed. When a control layer is included in the memory cell array 110, a control region including the write/read circuit 120 and the control logic unit 130 or the like may be described as being included in the memory cell array 110.

The write/read circuit 120 performs write and read operations on memory cells. The write/read circuit 120 is connected to the memory cells via the bit lines, and may include a write driver that writes data to the memory cells, and a sense amplifier that senses a resistance component of the memory cells. The write/read circuit 120 may perform a memory operation using various voltage signals under the control of the control logic unit 130.

The control logic unit 130 may control overall operations of the memory device 100, and may control the write/read circuit 120 to perform a memory operation such as a write operation or a read operation. For example, the control logic unit 130 may provide various voltage signals to the read/write circuit 120 to perform write and read operations on the memory device 100.

In at least some example embodiments, the control logic unit 130 may include a pulse power generating unit 160 (see FIG. 2) generating a write voltage (or a write current) or a read voltage (or a read current) provided to a selected memory cell, and a pulse power controller 132 (see FIG. 2) controlling the pulse power generated by using the pulse power generating unit 160. The pulse power generating unit 160 and the pulse power controller 132 will be described in detail later with reference to FIG. 2.

In a write operation on the memory device 100, variable resistance of a memory cell of the memory cell array 110 may be increased or decreased according to written data. For example, each of memory cells of the memory cell array 110 may have a resistance value according to currently stored data, and the resistance value of the memory cell array 110 may be increased or decreased according to data that is to be written to each of the memory cells. A write operation as described above may be classified as a reset write operation or a set write operation. A set state in a resistive memory cell may have a relatively low resistance value, whereas a reset state may have a relatively high resistance value. In a reset write operation, a write operation is performed in a direction in which variable resistance increases, whereas in a set write operation, a write operation is performed in a direction in which variable resistance is decreased.

Various types of data may be stored in the memory device 100. For example, data for which an operation such as a write or read is requested by a user (e.g., user data) may be stored in the memory device 100. Also, data other than user data may be stored in the memory cell array 110. Examples of data other than user data include booting code, system code, application software, or the like, related to operation of a system including the memory device. Also, when storing data, as error correction code (ECC) encoding on the data is performed, an ECC parity is generated and stored in the memory cell array 110. Alternatively, various pieces of reference information related to a memory operation may be stored in the memory cell array 110, and memory cells storing the reference information may be read in the memory operation.

The memory controller 1000 and the memory device 100 may be integrated into a semiconductor device. For example, the memory controller 1000 and the memory device 100 may be integrated into a semiconductor device, and thus, may be configured as a memory card. In one example, the memory controller 1000 and the memory device 100 may be integrated into a semiconductor device, and thus, may be configured as a PC card (e.g., a PCMCIA card), a compact flash (CF) card, a smart media card (SM/SMC), a memory stick, a multimedia card (e.g., MMC, RS-MMC, or MMCmicro, an SD card, such as a SD, miniSD, or microSD), or a universal flash storage (UFS) device. As another example, the memory controller 1000 and the memory device 100 may be integrated into a semiconductor device, and thus, may be configured as a Solid State Disk/Drive (SSD).

Example operation of the memory device 100 included in the memory system 10 will be described in more detail below with reference to FIG. 2.

Figure 2:
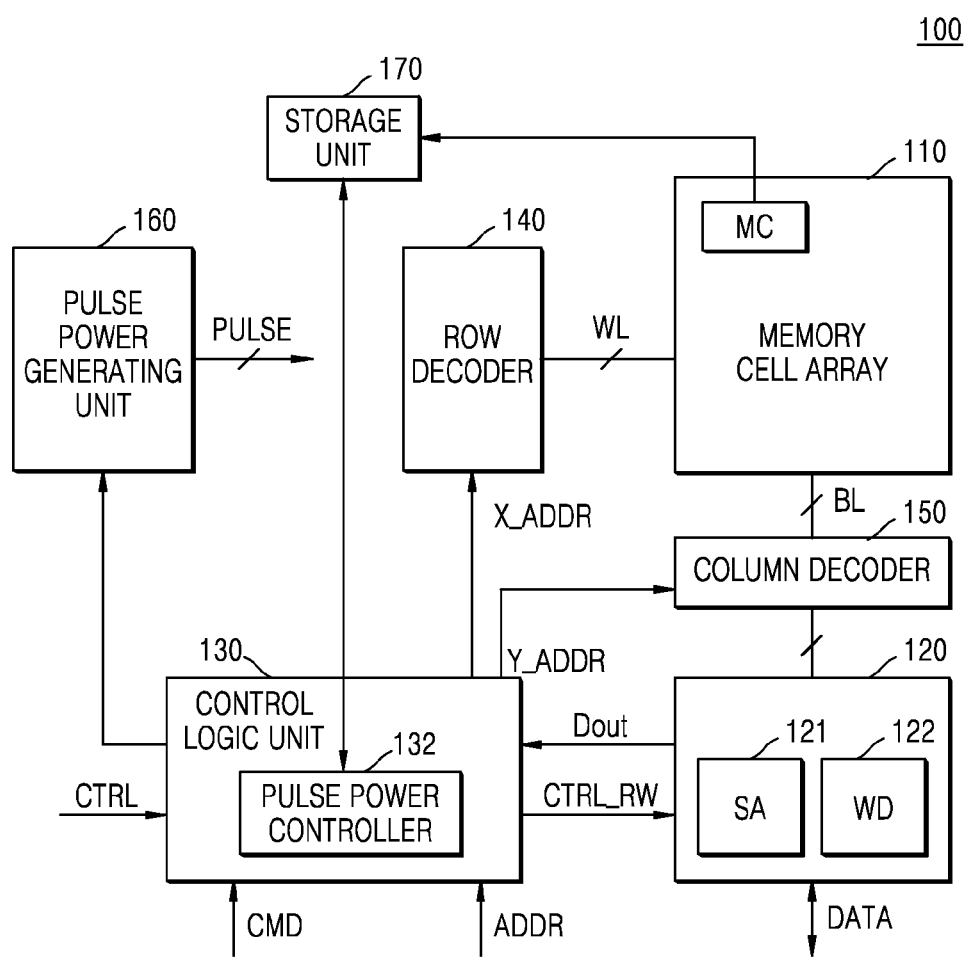
FIG. 2 is a block diagram illustrating an example embodiment of the memory device of FIG. 1.

FIG. 2 is a block diagram illustrating an example embodiment of the memory device 100 of FIG. 1.

Referring to FIG. 2, the memory device 100 may include the memory cell array 110, the write/read circuit 120, the control logic unit 130, the pulse power generating unit 160, and a storage unit 170. The memory device 100 may further include a row decoder 140 and a column decoder 150. The write/read circuit 120 may include a sense amplifier 121 and a write driver 122. The control logic unit 130 may include the pulse power controller 132 controlling a pulse power generated by the pulse power generating unit 160.

In at least this example embodiment, the pulse power generating unit 160 is external to the control logic unit 130, whereas the pulse power controller 132 is included in the control logic unit 130. However, example embodiments of inventive concepts are not limited thereto. That is, for example, the control logic unit 130 may be described as including various hardware and software units or circuits to control an overall operation of the memory device 100, and actual implementation examples and functional ranges of the control logic unit 130 and the pulse power generating unit 160 are not limited to the example embodiments of inventive concepts described herein.

The storage unit 170 according to example embodiments is illustrated as being included in the memory device 100. However, example embodiments of inventive concepts are not limited to this example. Rather, the storage unit 170 may be external to the memory device 100.

An example structure and operation of the memory device 100 illustrated in FIG. 2 is described in more detail below.

The memory cell array 110 may be connected to a plurality of first signal lines and a plurality of second signal lines. Also, the memory cell array 110 may include a plurality of memory cells respectively arranged in regions where the plurality of first signal lines and the plurality of second signal lines cross each other. Hereinafter, the description will focus on an example embodiment in which a plurality of first signal lines are bit lines BL, and a plurality of second signal lines are word lines WL.

An address ADDR for indicating an access-target memory cell may be received. The address ADDR may include a row address X_ADDR for selecting a word line of the memory cell array 110 and a column address Y_ADDR for selecting a bit line of the memory cell array 110. The row decoder 140 performs a word line selecting operation in response to the row address X_ADDR, and the column decoder 150 performs a bit line selecting operation in response to the column address Y_ADDR.

The write/read circuit 120 may be connected to a bit line BL to write data to a memory cell, or read data from the memory cell. For example, the write/read circuit 120 may receive a write pulse from the pulse power generating unit 160, and the write driver 122 may provide a write voltage or a write current, based on the received write pulse, to the memory cell array 110 via the column decoder 150. In more detail, if a set pulse is received, then the write driver 122 may provide a set current or a set voltage to the memory cell array 110 in response to the set pulse. If a reset pulse is received, then the write driver 122 may provide a reset current or a reset voltage to the memory cell array 110 in response to the reset pulse.

In a data reading operation, the write/read circuit 120 may generate a read current (or read voltage) for a read operation and provide the same to a memory cell. The sense amplifier 121 may include a current generating unit (or voltage generating unit), and a comparing unit that is connected to a node of a bit line (e.g., a sensing node) to determine data. An end of the comparing unit may be connected to a sensing node, and the other end of the comparing unit may be connected to a reference voltage to thereby determine a data voltage.

The pulse power generating unit 160 may transmit a pulse power controlled by the pulse power controller 132 to a selected memory cell MC so as to write data on the selected memory cell.

The storage unit 170 may perform the function of storing and managing a memory cell coefficient C of a memory cell MC. The memory cell coefficient C may be obtained by performing a test, which may precede performance of functions of the memory cell MC in the memory device 100. The memory cell coefficient C may be a coefficient that is determined based on at least one of a material of the memory cell MC, a structure of the memory cell MC, and a size of a memory cell array including the memory cell MC.

The memory cell coefficient C may be obtained by a test operation or the like, and the memory cell coefficient C may be different according to characteristics of memory cells of a memory cell array.

A plurality of pulse power specifications (also referred to herein as "specs") that satisfy the memory cell coefficient C may be calculated by performing a test. When data is written according to one of the plurality of pulse power specs that satisfy a single memory cell coefficient C, the same or substantially the same write operation may be performed on memory cells such that the memory cells have the same or substantially the same resistance level distribution. That is, for example, even if a plurality of pulse powers have different voltage levels and different pulse widths from one another, the same write operation may be performed on memory cells if the pulse powers satisfy the same memory cell coefficient C.

Information about the memory cell coefficient C and pulse power specs obtained as described above may be stored in the memory device 100.

Still referring to FIG. 2, the storage unit 170 may store and manage not only the memory cell coefficient C, but also a pulse power spec determined based on (or by referring to) the memory cell coefficient C. Here, a plurality of pulse power specs may satisfy one memory cell coefficient C as will be described in more detail later with reference to FIG. 6.

In at least some example embodiments, the storage unit 170 may store information about the memory cell coefficient C and/or pulse power specs as non-volatile data.

In at least some other example embodiments, the storage unit 170 may store information about the memory cell coefficient C and/or pulse power specs as volatile data. In this case, the information about the memory cell coefficient C and pulse power specs may be stored as non-volatile data in a portion of the memory cell array 110, and as the memory device 100 is driven the information stored in the memory cell array 110 may be loaded to the storage unit 170. The control logic unit 130 may control the pulse power generating unit 160 based on (or by referring to) the information of the memory cell coefficient C and the pulse power specs stored in the storage unit 170. The pulse power generating unit 160 may generate a pulse power having a given (or, alternatively, desired or predetermined) voltage level and a given (or, alternatively, desired or predetermined) pulse width under the control of the control logic unit 130.

The control logic unit 130 may output various control signals CTRL_RW for writing data to the memory cell array 110 or reading data from the memory cell array 110, based on a command CMD, an address ADDR, and/or a control signal CTRL received from the memory controller 1000. By doing so, the control logic unit 130 may control various overall operations in the memory device 100.

In more detail, for example, the control logic unit 130 according to at least this example embodiment may control the pulse power generating unit 160. That is, for example, the control logic unit 130 may control a voltage level and/or a width of a pulse based on pulse power specs for performing a write operation on a memory cell MC.

For example, if a memory cell MC is a single-level cell (SLC), then the pulse power controller 132 may control pulse powers generated in the pulse power generating unit 160 such that the pulse powers have a pulse power spec satisfying the same or substantially the same memory cell coefficient C. Example operation of the memory device 100, wherein the memory cell MC is a SLC, will be described in more detail later with reference to FIGS. 6 through 10.

Figure 12:
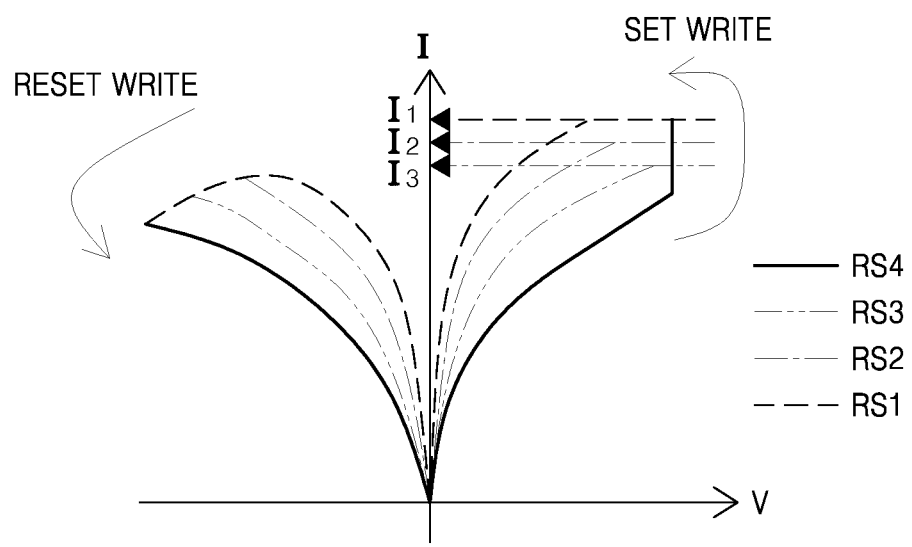
FIG. 12 is a graph showing example current-voltage characteristics of a memory cell having the distribution of FIG. 11.
Figure 13:
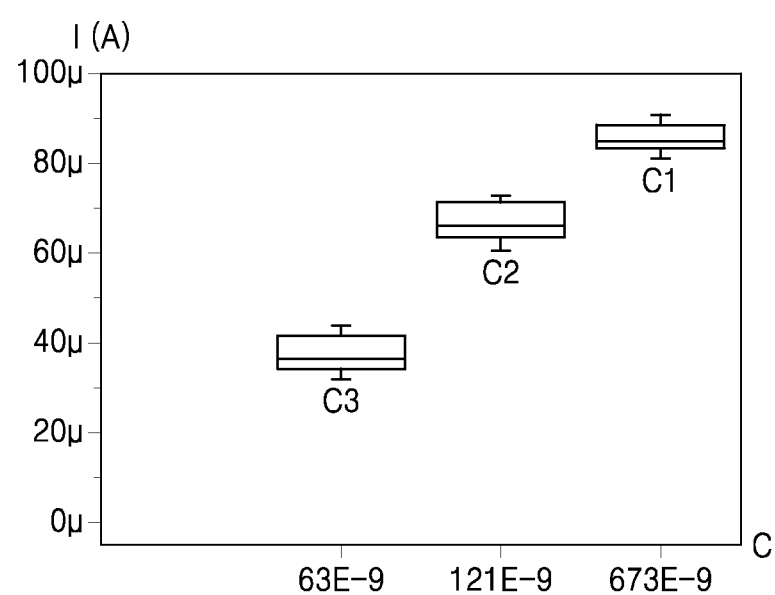
FIG. 13 is a graph showing an example current curve according to a memory cell coefficient when a memory cell is a multilevel cell.

If a memory cell MC is a multilevel cell (MLC), then the pulse power controller 132 may control a voltage level and/or a pulse width such that a pulse power generated by the pulse power generating unit 160 satisfies a memory cell coefficient from among a plurality of memory cell coefficients (e.g., memory cell coefficients C1 through C3 of FIG. 13). Example operation of the memory device 100 when the memory cell MC is a MLC will be described in more detail later with reference to FIGS. 11 through 14.

Figure 3:
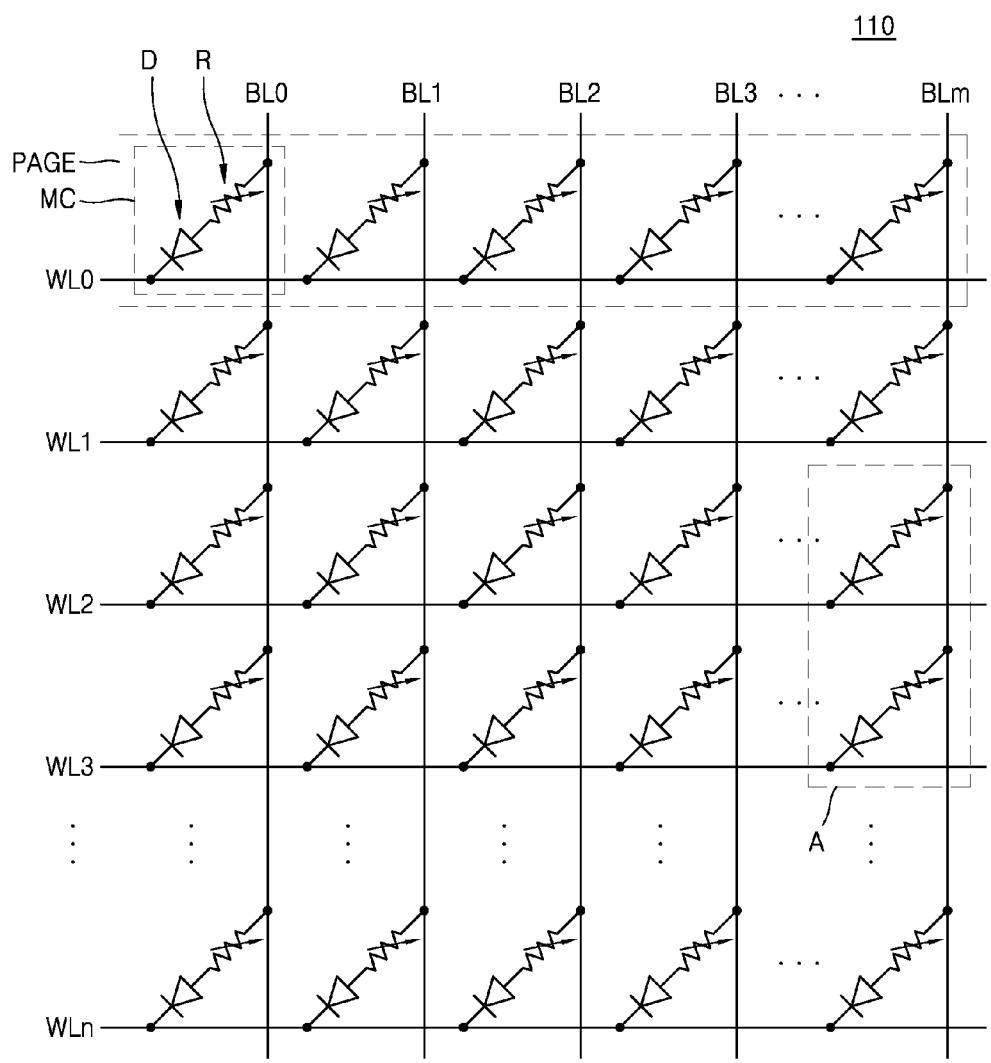
FIG. 3 is a circuit diagram illustrating an example embodiment of the memory cell array of FIG. 1.

FIG. 3 is a circuit diagram illustrating an example embodiment of the memory cell array 110 of FIG. 1.

Referring to FIG. 3, the memory cell array 110 included in each layer may be a two-dimensional memory on a X-Y plane, and may include a plurality of word lines WL1 through WLn, a plurality of bit lines BL1 through BLm, and a plurality of memory cells MC. Here, the number of the word lines WL, the number of the bit lines BL, and the number of the memory cells MC may vary according to one or more example embodiments. Also, a set of memory cells MC that may be concurrently and/or simultaneously accessed by the same word line may be defined as a page.

According to at least this example embodiment, each of the plurality of memory cells MC may include a variable resistor device R and a selection device D. The variable resistor device R may also be referred to as a variable resistance material, and the selection device D may be referred to as a switching device.

According to at least one example embodiment, the variable resistor device R is connected between one of a plurality of bit lines BL0 through BLm and the selection device D, and the selection device D may be connected between the variable resistor device R and one of a plurality of word lines WL0 through WLn. However, example embodiments are not limited to this example. Rather, the selection device D may be connected between one of a plurality of bit lines BL0 through BLm and the variable resistor device R, and the variable resistor device R may be connected between the selection device D and one of a plurality of word lines WL0 through WLn.

The selection device D may be connected between one of a plurality of word lines WL0 through WLn and the variable resistor device R, and may control a current supply to the variable resistance device R according to a voltage applied to a connected word line and a connected bit line. While the selection device D is illustrated as a diode in FIG. 3, this is only an example. According to one or more example embodiments, the selection device D may be implemented as other switchable devices.

Figure 4A:
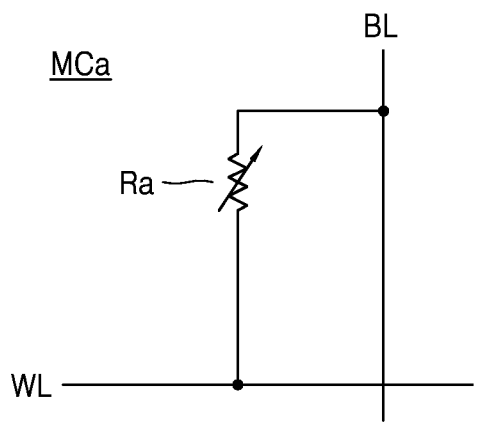
FIGS. 4A through 4C are circuit diagrams illustrating examples of a memory cell of FIG. 3.
Figure 4B:
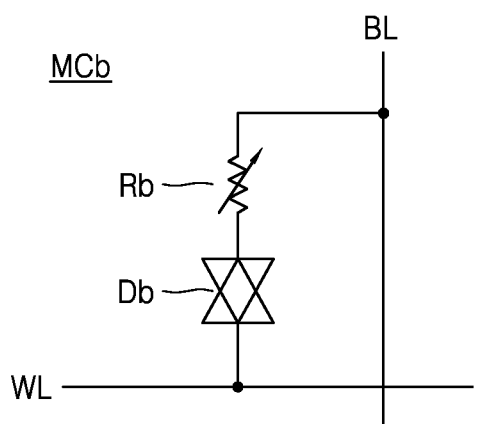
Figure 4C:
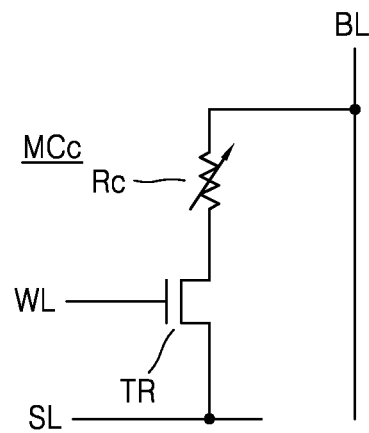

FIGS. 4A through 4C are circuit diagrams illustrating examples of memory cells MC included in the memory cell array 110 of FIG. 3.

Referring to FIG. 4A, a memory cell MCa may include a variable resistor device Ra connected between a bit line BL and a word line WL. The memory cell MCa may store data due to voltages that are respectively applied to the bit line BL and the word line WL.

Referring to FIG. 4B, a memory cell MCb may include a variable resistor device Rb and a bidirectional diode Db. The variable resistor device Rb may include a resistive material to store data. The bidirectional diode Db may be connected between the variable resistor device Rb and a word line WL, and the variable resistor device Rb may be connected between a bit line BL and the bidirectional diode Db. Positions of the bidirectional diode Db and the variable resistor device Rb may be changed with respect to each other. By using the bidirectional diode Db, a leakage current that may flow to a non-selected resistor cell may be reduced.

Referring to FIG. 4C, a memory cell MCc may include a variable resistor device Rc and a transistor TR. The transistor TR may be a selection (or switching) device that supplies or blocks a current to the variable resistor device Rc according to a voltage of the word line WL. According to at least the example embodiment shown in FIG. 4C, in addition to the word line WL, a source line SL that adjusts voltage levels at two ends of the variable resistor device Rc may be further included. The transistor TR may be connected between the variable resistor device Rc and the source line SL, and the variable resistor device Rc may be connected between a bit line BL and the transistor TR. Positions of the transistor TR and the variable resistor device Rc may be changed with respect to each other. The memory cell MCc may be selected or not selected according to ON or OFF of the transistor TR that is driven via the word line WL.

Figure 5:
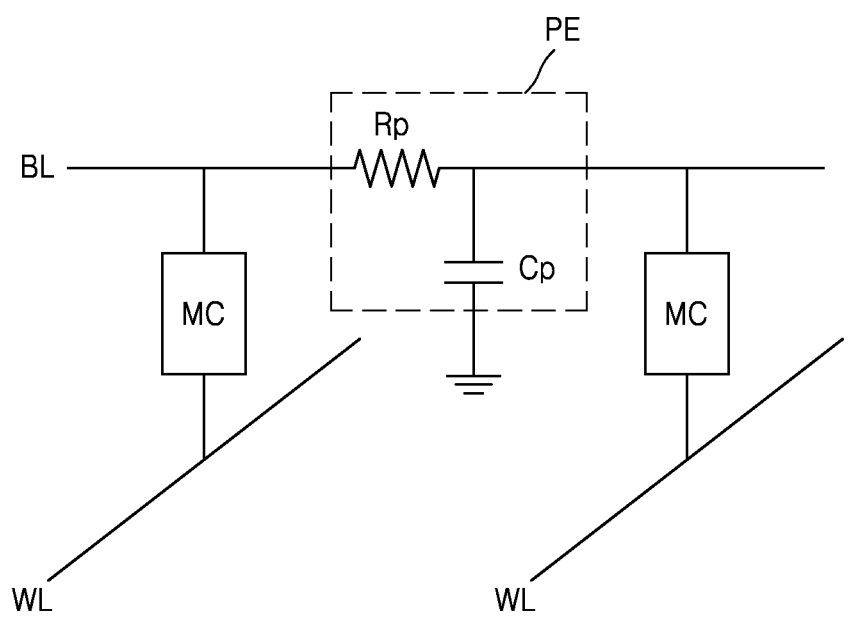
FIG. 5 is a conceptual diagram for explaining an example parasitic element that may be present in a memory cell array, where portion A in FIG. 3 is expanded.

FIG. 5 is a conceptual diagram for explaining an example parasitic element that may be present in the memory cell array 110, where portion A of FIG. 3 is expanded.

Referring to FIG. 5, the memory cells MC described with reference to FIG. 3 are located at points of intersection between word lines WL and a bit line BL, and a parasitic element PE is formed between the memory cells MC. The parasitic element PE may include parasitic impedance, such as parasitic resistance Rp and a parasitic capacitance Cp. The parasitic element PE, according to at least this example embodiment, is illustrated as being formed on the bit line BL, but is not limited thereto, and may also be formed on the word line WL.

In at least some cases, the parasitic impedance may suppress and/or prevent a voltage signal for performing a write operation, or the like, from being completely transmitted to the memory cell MC. This phenomenon may occur more frequently as a degree of integration of the memory cell array 110 increases and/or as memory cell size in the memory cell array 110 decreases even if the degree of integration is constant or substantially constant.

Due to signal deterioration resulting from the parasitic impedance, if a peak voltage applied to the memory cell MC is smaller than a write voltage for performing a write operation on the memory cell MC, then the write operation on the memory cell MC may not be properly performed. Thus, a pulse power control allowing a more stable write operation by considering the parasitic impedance is required. The memory device 100 and/or methods of controlling the memory device 100 according to one or more example embodiments discussed herein may enable a more stable write operation to be performed by considering parasitic capacitance.

Figure 6:
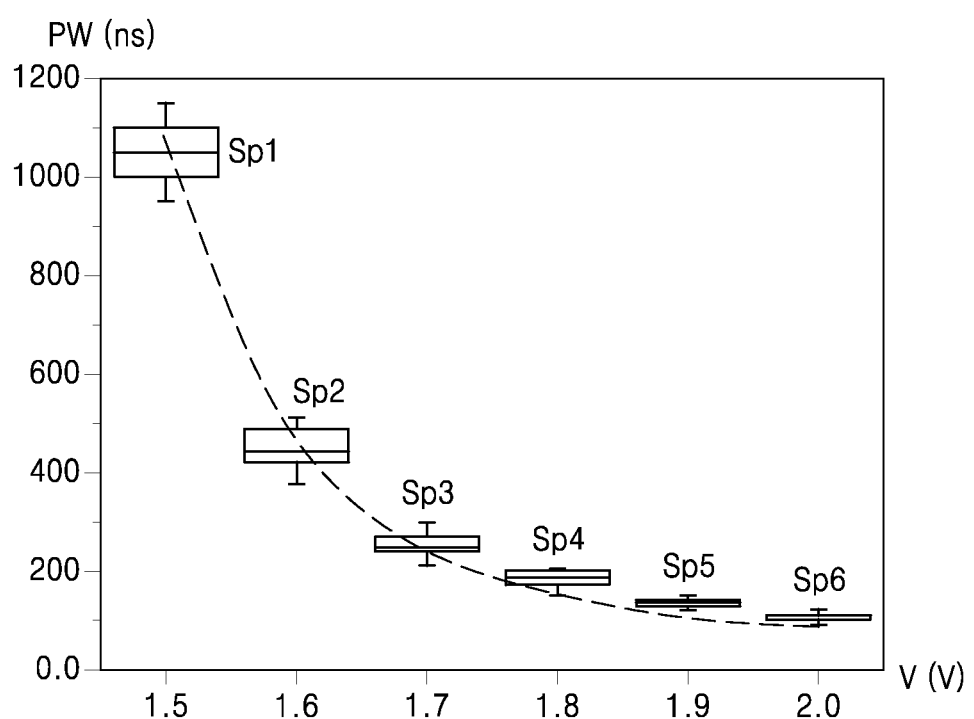
FIG. 6 is a graph showing various example pulse power specifications (also referred to herein as "specs") that may be transmitted to a memory cell according to an example embodiment, if a memory cell of FIG. 3 is a single level cell.

FIG. 6 is a graph showing example pulse power specs that may be transmitted to a memory cell according to an example embodiment, if a memory cell of FIG. 3 is a SLC.

Referring to FIG. 6, first through sixth pulse power specs Sp1 through Sp6 for performing the same or substantially the same (e.g., identical) write operations on memory cell MC (i.e., that allow the memory cell MC to have the same or substantially the same, e.g., identical, resistance states) are illustrated.

As illustrated in FIG. 6, the first through sixth pulse power specs Sp1 through Sp6 may have different voltage levels V and/or different pulse widths PW from one another.

In more detail, a first pulse power spec Sp1 has a voltage level of about 1.5 V and a pulse width of about 1000 ns to about 1100 ns; a second pulse power spec Sp2 has a voltage level of about 1.6 V and a pulse width of about 400 ns to about 500 ns; a third pulse power spec Sp3 has a voltage level of about 1.7 V and a pulse width of about 250 ns to about 300 ns; a fourth pulse power spec Sp4 has a voltage level of about 1.8 V and a pulse width of about 150 ns to about 200 ns; a fifth pulse power spec Sp5 has a voltage level of about 1.9 V and a pulse width of about 130 ns to about 150 ns; and a sixth pulse power spec Sp6 has a voltage level of about 2.0 V and a pulse width of about 100 ns to about 130 ns.

The first through sixth pulse power specs Sp1 through Sp6 may have the relationship expressed in Equation 1 to perform the same or substantially the same (e.g., identical) write operations on the memory cell MC. That is, for example, when voltage values V and pulse widths PW of the respective pulse power specs Sp1 through Sp6 are substituted in Equation 1, memory cell coefficients C of the respective pulse power specs Sp1 through Sp6 may have the same or substantially the same values.

$$(V-Vos)^2 \times PW = C \quad \text{[Equation 1]}$$

In Equation 1, V denotes a voltage level of the respective pulse power specs Sp1 through Sp6, and Vos denotes an offset voltage, PW denotes a pulse width of the respective pulse power specs Sp1 through Sp6, and C denotes a memory cell coefficient for the memory cell.

The offset voltage Vos may be a constant indicating a minimum voltage level for performing a write operation on the memory cell MC. That is, no matter how great a pulse width of a pulse power is, if a voltage value V of a pulse power is smaller than the offset voltage Vos, then a write operation may not be performed on a memory cell MC. In at least some example embodiments, if a voltage level V of a pulse power is greater than the offset voltage level Vos, a write operation may be performed, whereas if a voltage level V of a pulse power is smaller than the offset voltage level Vos, a read operation may be performed.

If the memory cell coefficients C of the respective pulse power specs Sp1 through Sp6 are the same or substantially the same as in this example embodiment, even when a pulse power according to any one of the respective pulse power specs Sp1 through Sp6 is transmitted to the memory cell array 110, the same write operation may be performed on the memory cell MC. Furthermore, by obtaining a memory cell coefficient C of a more stable write operation performed in a given (or, alternatively, desired or predetermined) memory cell MC, a pulse power spec that allows for a more stable write operation on the memory cell MC may be determined despite parasitic impedance or the like.

Figure 7:
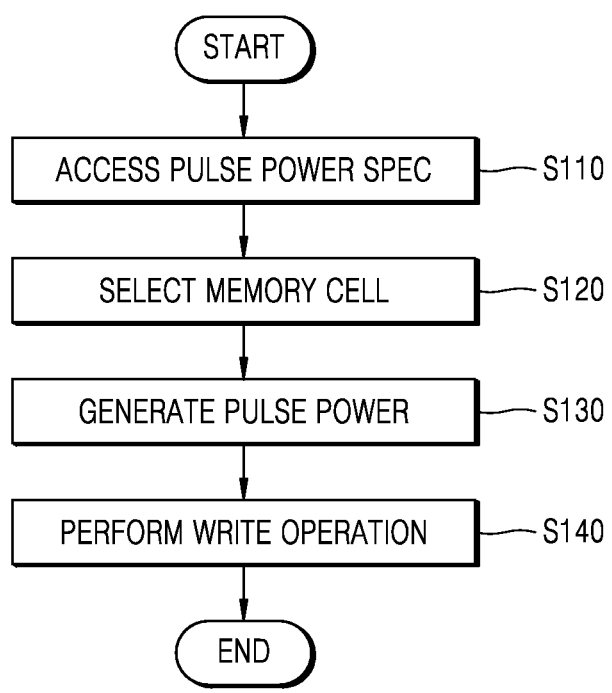
FIG. 7 is a flowchart illustrating a method of controlling a resistive memory device according to an example embodiment of inventive concepts, where an example embodiment of a method of performing a write operation on a memory cell, which is a single level cell, is illustrated.

FIG. 7 is a flowchart illustrating an example embodiment of a method of controlling a resistive memory device, where a method of performing a write operation on a memory cell, which is a SLC, is illustrated. With regard to the description with reference to FIG. 7, some elements illustrated in FIGS. 1 through 6 may be referred to.

Referring to FIG. 7, the method of performing a write operation may include accessing a pulse power spec (operation S110), selecting a memory cell (operation S120), generating a pulse power (operation S130), and performing a write operation (operation S140).

Operation S110 of accessing a pulse power spec may be performed by the pulse power controller 132. In more detail, for example, the pulse power controller 132 may access one of various pulse power specs stored in the storage unit 170 to provide a control signal for adjusting a voltage level and/or a pulse width of pulse power, to the pulse power generating unit 160.

In still greater detail, referring again to FIG. 2, the pulse power controller 132 may access one of the various pulse power specs Sp1 through Sp6 that satisfy the memory cell coefficient C to provide a control signal to the pulse power generating unit 160. As the pulse power specs Sp1 through Sp6 satisfy the memory cell coefficient C, if a pulse power has one of the pulse power specs Sp1 through Sp6, then the same write operation may be performed on a memory cell MC. Thus, in one example, the pulse power controller 132 may access an optimum pulse power spec from among the pulse power specs Sp1 through Sp6.

In at least some example embodiments, the pulse power controller 132 may access a pulse power spec in consideration of a limit of the pulse power generating unit 160.

For example, if a maximum voltage level output from the pulse power generating unit 160 is not enough to satisfy the memory cell coefficient C, then the pulse power controller 132 may access a power pulse spec (e.g., the first pulse power spec Sp1), which has a relatively large pulse width PW, but a relatively small voltage level V, from among the first through sixth pulse power specs Sp1 through Sp6.

As another example, if a maximum pulse width that may be output from the pulse power generating unit 160 is not enough to satisfy the memory cell coefficient C, then the pulse power controller 132 may access a pulse power spec (e.g., the sixth pulse power spec Sp6), which has a relatively high voltage level V, but a relatively small pulse width PW, from among the first through sixth pulse power specs Sp1 through Sp6.

In operation S120, a memory cell MC on which a write operation is to be performed may be selected from among a plurality of memory cells included in the memory cell array 110. In at least some example embodiments, operation S120 of selecting a memory cell may be performed by the control logic unit 130.

In operation S130 of generating a pulse power, the pulse power generating unit 160 may generate and output a pulse power having the accessed pulse power spec in response to the control signal provided by the pulse power controller 132. The pulse power may be transmitted to the memory cell MC selected in operation S120 of selecting a memory cell.

In operation S140 of performing a write operation, the pulse power generated by the pulse power generating unit 160 may be transmitted to the memory cell MC selected in operation S120, to perform a write operation. The pulse power generated by the pulse power generating unit 160 may pass through at least one of the write/read circuit 120, the row decoder 140, and the column decoder 150 to be transmitted to the memory cell MC. As the pulse power is transmitted to the memory cell MC, a resistance state (low resistance state (LRS) or high resistance state (HRS)) of the memory cell MC may be varied.

Figure 8:
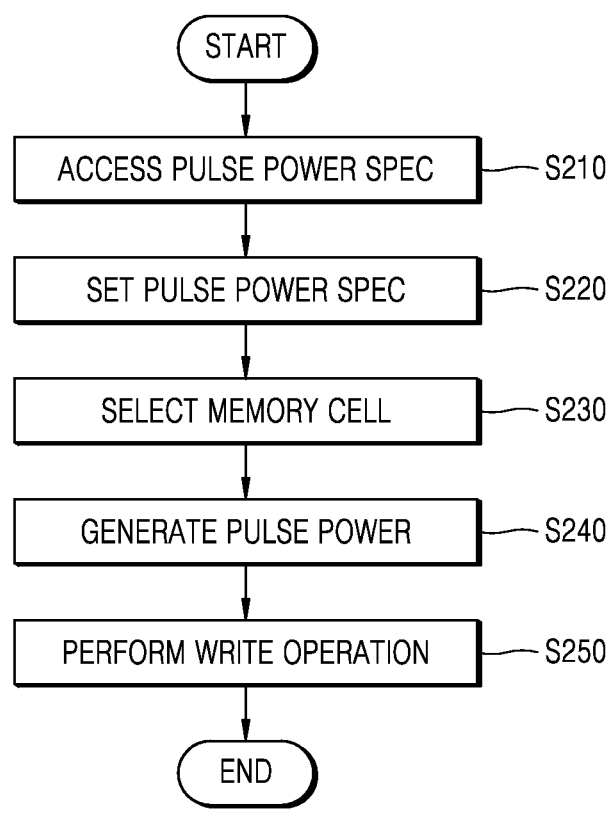
FIG. 8 is a flowchart illustrating a method of controlling a resistive memory device according to another example embodiment of inventive concepts.

FIG. 8 is a flowchart illustrating an example embodiment of a method of controlling a resistive memory device. With regard to description of FIG. 8, some of the elements illustrated in FIGS. 1 through 7 may be referred to, and these elements will be described with by referring to FIGS. 1 through 7 together.

Referring to FIG. 8, the method of controlling a resistive memory device may include accessing a pulse power spec (operation S210), setting a pulse power spec (operation S220), selecting a memory cell (operation S230), generating a pulse power having the set pulse power spec (operation S240), and performing a write operation (operation S250).

In operation S210 of accessing a pulse power spec, the pulse power controller 132 may access one of various pulse power specs stored in the storage unit 170.

In operation S220 of setting a pulse power spec, the pulse power controller 132 may set a pulse power spec such that the pulse power generating unit 160 generates a pulse power having the accessed pulse power spec in a write operation that may be performed later.

In operation S230 of selecting a memory cell, a memory cell MC on which a write operation is to be performed may be selected from among a plurality of memory cells included in the memory cell array 110. Operation S230 of selecting a memory cell may be performed in the same or substantially the same manner as operation S120 described with reference to FIG. 7.

In operation S240 of generating a pulse power, the pulse power generating unit 160 may generate a pulse power having the set pulse power spec.

In operation S250 of performing a write operation, the pulse power generated by the pulse power generating unit 160 may be transmitted to the memory cell MC to perform a write operation.

The method of controlling a resistive memory device according to at least this example embodiment is different from the method of controlling a resistive memory device described with reference to FIG. 7 in that, when an individual write operation is performed, a pulse power spec is not accessed from the storage unit 170 every time, but rather a pulse power spec is accessed only at an initial stage of an operation (or in an environment setting operation or the like). That is, for example, in an initial write operation after a pulse power spec is accessed and set, a pulse power may be generated based on the previously set pulse power spec without accessing a pulse power spec again in subsequent write operations.

Figure 9:
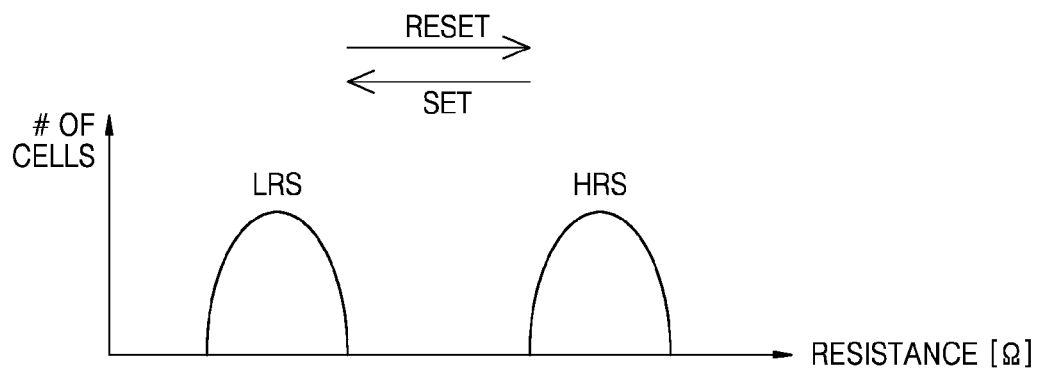
FIG. 9 is a graph showing an example distribution of memory cells according to resistance if a memory cell is a single level cell.

FIG. 9 is a graph showing an example distribution of memory cells according to resistance if a memory cell MC is a SLC.

Referring to FIG. 9, a horizontal axis denotes resistance, and a vertical axis denotes the number of memory cells. In this example, if a memory cell MC is a SLC storing 1 bit of data, then the memory cell MC may have a low resistance state LRS or a high resistance state HRS.

The low resistance state LRS and the high resistance state HRS may correspond to one of data '0' and data '1'. According to at least some example embodiments, a resistance level R may increase in an order of data '0' and data '1'. That is, for example, the low resistance state LRS may correspond to data '0', and the high resistance state HRS may correspond to data '1'.

An operation of applying a write pulse to a memory cell MC to switch the memory cell from the high resistance state HRS to the low resistance state LRS may be referred to as a set operation or a set write operation. An operation of applying a write pulse to a memory cell MC to switch the memory cell from the low resistance state LRS to the high resistance state HRS may be referred to as a reset operation or a reset write operation.

The write operation may be performed by a pulse power having one of the pulse power specs Sp1 through Sp6 described with reference to FIG. 6. That is, for example, each of the pulse power specs Sp1 through Sp6 may satisfy the same or substantially the same memory cell coefficient C described with reference to FIG. 6, and if the pulse power specs Sp1 through Sp6 satisfy the same memory cell coefficient C, then the same or substantially the same set write operation, or the same or substantially the same reset operation, may be performed on a memory cell MC even when the pulse power specs Sp1 through Sp6 have different voltage levels V and different pulse widths PW.

Figure 10:
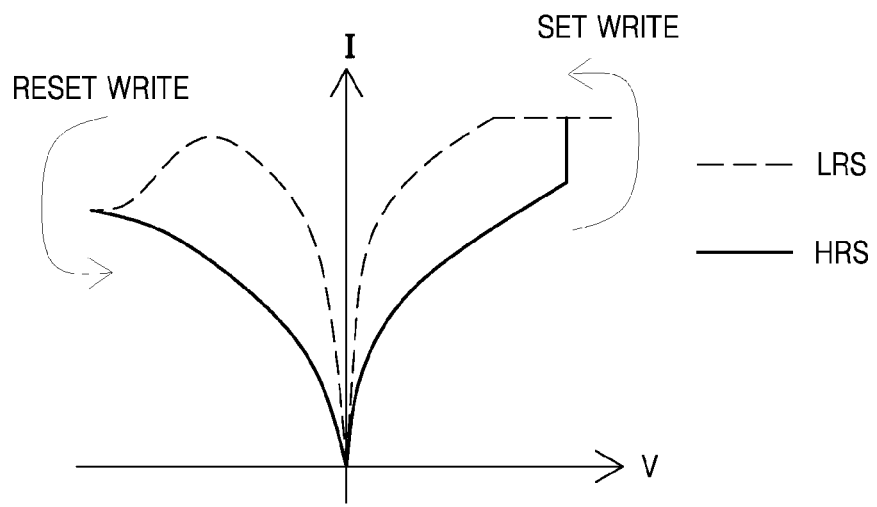
FIG. 10 is a graph showing example current-voltage characteristics of a memory cell having the distribution of FIG. 9.

FIG. 10 is a graph showing example current-voltage characteristics of a memory cell MC having the distribution of FIG. 9.

Referring to FIG. 10, a horizontal axis denotes a voltage V, and a vertical axis denotes a current I. As described with reference to FIG. 9, if the memory cell MC is a SLC, then the memory cell MC may have a high resistance state HRS or a low resistance state LRS according to stored data.

The memory cell MC may exhibit a switching behavior in a state of a set write operation from the high resistance state HRS to the low resistance state LRS as a voltage in a first direction (e.g., a positive voltage) is increased. Also, the memory cell MC may exhibit a switching behavior in a state of a reset write operation from the low resistance state LRS to the high resistance state HRS as a voltage in a direction opposite to the voltage in the first direction (e.g., a negative voltage) is increased.

The switching behavior in the state of the set write operation or the switching behavior in the state of the reset write operation may be conducted by a pulse power having one of the pulse power specs Sp1 through Sp6 described with reference to FIG. 6. As described above, the memory cell MC may have a low resistance state LRS or a high resistance state HRS so as to display digital information "ON" or "OFF."

Figure 11:
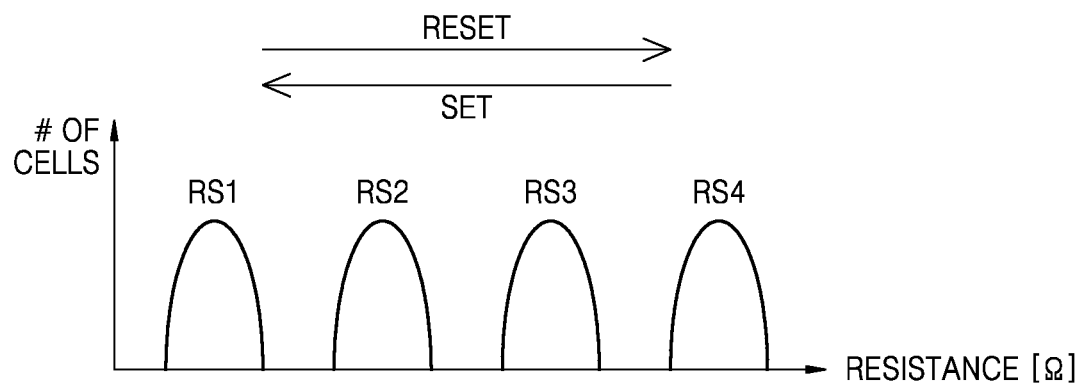
FIG. 11 is a graph showing an example distribution of memory cells according to resistance if the memory cells are multilevel cells.

FIGS. 11 through 13 are diagrams for explaining an example embodiment of a method of realizing a MLC.

FIG. 11 is a graph showing an example distribution of memory cells according to resistance if a memory cell is a MLC.

Referring to FIG. 11, a horizontal axis denotes resistance, and a vertical axis denotes the number of memory cells. For example, if the memory cell MC is a MLC that may store at least two-bit data, then the memory cell MC may have one of a first resistance state RS1, a second resistance state RS2, a third resistance state RS3, and a fourth resistance state RS4.

However, example embodiments are not limited to this example. Rather, according to at least some example embodiments, the plurality of memory cells may include triple level cells (TLC) that store three-bit data, and thus, may have one of eight resistance states. According to at least some other example embodiments, the plurality of memory cells may include memory cells capable of storing at least four-bit data, etc.

Each of the first through fourth resistance states RS1, RS2, RS3, RS4 may correspond to one of data '00', data '01', data '10', and data '11'. In at least some example embodiments, a resistance level may increase in an order from data '11', data '01', data '00', and data '10'. That is, for example, the first resistance state RS1 may correspond to data '11', the second resistance state RS2 may correspond to data '01', the third resistance state RS3 may correspond to data '00', and the fourth resistance state RS4 may correspond to data '10'.

FIG. 12 is a graph showing example current-voltage characteristics of a memory cell MC having the distribution of FIG. 11.

Referring to FIG. 12, a horizontal axis denotes a voltage V, and a vertical axis denotes a current I. As described above with reference to FIG. 11, if the memory cell MC is a MLC, then the memory cell MC may have one of the first through fourth resistance states RS1, RS2, RS3, and RS4 according to stored data.

According to at least this example embodiment, by changing an amplitude of the current I applied to the memory cell MC via a pulse power, the memory cell MC may be switched from the fourth resistance state RS4 to one of the first through third resistance states RS1, RS2, and RS3. In more detail, when a first write current I1 is applied to the memory cell MC, the memory cell MC may be switched from the fourth resistance state RS4 to the first resistance state RS1. When a second write current I2 is applied to the memory cell MC, the memory cell MC may be switched from the fourth resistance state RS4 to the second resistance state RS2. When a third write current I3 is applied to the memory cell MC, the memory cell MC may be switched from the fourth resistance state RS4 to the third resistance state RS3.

An example embodiment of a method of changing the amplitude of the current I flowing to the memory cell MC described above is discussed in more detail below.

FIG. 13 is a graph showing an example current (I) curve according to a memory cell coefficient C when a memory cell MC is a MLC.

Referring to FIG. 13, the MLC may have a plurality of memory cell coefficients C1, C2, and C3. As can be seen from FIG. 13, currents I flowing to the memory cell MC are different when the memory cell coefficients C are different. For example, if a first memory cell coefficient C1 is about $673 \times 10^{-9}$, then a current of about 80 uA to about 90 uA may flow to the memory cell MC. If a second memory cell coefficient C2 is about $121 \times 10^{-9}$, then a current of about 60 uA to about 80 uA may flow to the memory cell MC. If a third memory cell coefficient C3 is about $63 \times 10^{-9}$, then a current of about 30 uA to about 50 uA may flow to the memory cell MC.

Based on the above result, the current I flowing to the memory cell MC may be changed by varying a memory cell coefficient C of a pulse power spec, and in this case, the memory cell MC may operate as a MLC. A more detailed example of this operation is described below.

Figure 14:
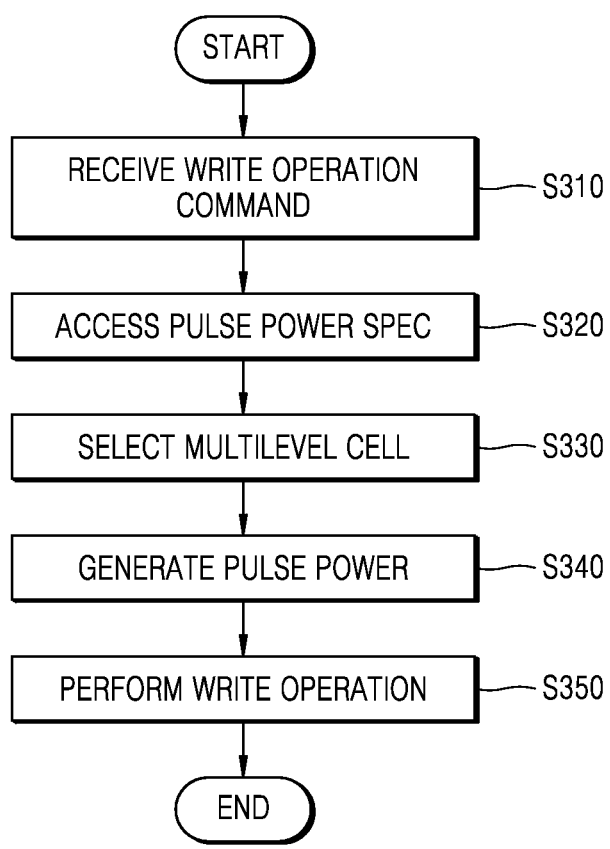
FIG. 14 is a flowchart illustrating a method of controlling a resistive memory device according to another example embodiment of inventive concepts, where an example embodiment of a method of performing a write operation on a memory cell, which is a multilevel cell, is illustrated.

FIG. 14 is a flowchart illustrating an example embodiment of a method of controlling a resistive memory device, where a method of performing a write operation on a memory cell MC, which is a MLC, is illustrated. With regard to description with reference to FIG. 14, some of the elements illustrated in FIGS. 1 through 13 may be referred to, and these elements will be described with by referring to FIGS. 1 through 13 together.

The MLC in at least this example embodiment may have a plurality of resistance states, for example, first through third resistance states RS1, RS2, and RS3 (see FIG. 11), and the first through memory cell coefficients C1, C2, and C3 (see FIG. 13) correspond to the first through third resistance states RS1, RS2, and RS3, respectively.

Although the MLC is described as having the three memory cell coefficients (C1, C2, and C3), example embodiments are not limited thereto. For example, if a memory cell MC is a TLC storing three-bit data, then the memory cell MC may have seven memory cell coefficients.

Referring to FIG. 14, the method of performing a write operation on the MLC may include receiving a write operation command (operation S310), accessing a pulse power spec (S320), selecting a MLC (operation S330), generating a pulse power (operation S340), and performing a write operation (operation S350). At least one of the receiving a write operation command (operation S310), the accessing a pulse power spec (S320), and the selecting a MLC (operation S330) may be performed by using the pulse power controller 132 described with reference to FIG. 2.

In operation S310 of receiving a write operation command, a command including information indicating what type of write operation is to be performed on the MLC may be received. In other words, as described above with reference to FIGS. 11 through 13, the MLC may have the first through fourth resistance states RS1, RS2, RS3, and RS4, and different write operations may be performed depending to what resistance state the MLC is to be switched to, and thus, a command, which includes information indicating to which of the first through fourth resistance states RS1, RS2, RS3, and RS4 the MLC is to be switched, may be received.

For example, if the MLC is switched to the first resistance state RS1, then a first write operation may be performed; if the MLC is switched to the second resistance state RS2, then a second write operation may be performed; if the MLC is switched to the third resistance state RS3, then a third write operation may be performed.

In operation S320 of accessing a pulse power spec, a pulse power spec corresponding to the received command may be accessed. That is, for example, the pulse power controller 132 may access a pulse power spec that satisfies a memory cell coefficient corresponding to the write operation requested to be performed via the command.

For example, if the first write operation is requested, then the pulse power controller 132 may access a pulse power satisfying the first memory cell coefficient C1. If the second write operation is requested, then the pulse power controller 132 may access a pulse power satisfying the second memory cell coefficient C2. If the third write operation is requested, then the pulse power controller 132 may access a pulse power satisfying the third memory cell coefficient C3.

As described above with reference to FIG. 6, various pulse power specs may respectively satisfy the memory cell coefficients C1 through C3, and the pulse power controller 132 may access one of the various pulse power specs.

Operation S330 of selecting a MLC may be similar or substantially similar to operation S130 of selecting a memory cell described with reference to FIG. 7, differing only in that a memory cell MC is a MLC. Operation S330 of selecting a MLC may be performed by the control logic unit 130 described with reference to FIG. 2.

Operation S340 of generating a pulse power is the same or substantially the same as operation S120 of generating a pulse power described with reference to FIG. 7, and thus, repeated description thereof will be omitted.

In operation S350 of performing a write operation, a pulse power generated by the pulse power generating unit 160 may be transmitted to the MLC to perform a write operation.

Operation S350 of performing a write operation may be similar to operation S140 of performing a write operation described with reference to FIG. 7. However, operation S350 of performing a write operation may be one of various write operations, that is, the first through third write operations.

As in this example embodiment, the MLC may be realized by transmitting a pulse power having a pulse power spec satisfying memory cell coefficients respectively corresponding to various write operations that may be performed on a MLC.

Figure 15:
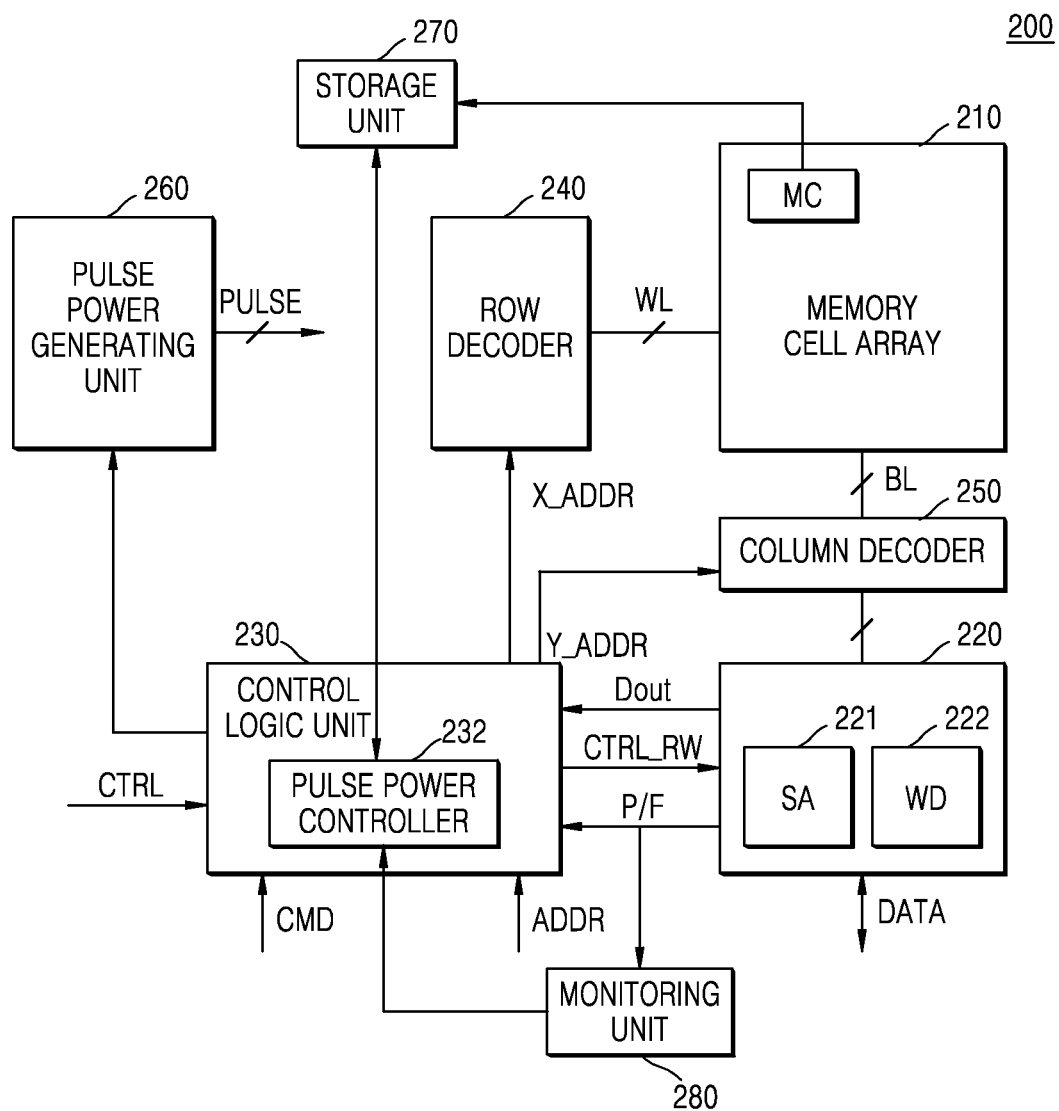
FIG. 15 is a block diagram illustrating a memory device according to another example embodiment of inventive concepts.

FIG. 15 illustrates a memory device 200 according to another example embodiment of inventive concepts.

Referring to FIG. 15, the memory device 200 may include a memory cell array 210, a write/read circuit 220, a control logic unit 230, a row decoder 240, a column decoder 250, a pulse power generating unit 260, and a storage unit 270.

The memory cell array 210, the write/read circuit 220, the control logic unit 230, the row decoder 240, the column decoder 250, the pulse power generating unit 260, and the storage unit 270 may perform operations the same or substantially the same as that of the memory cell array 110, the write/read circuit 120, the control logic unit 130, the row decoder 140, the column decoder 150, the pulse power generating unit 160, and the storage unit 170, respectively. Thus, a detailed discussion of these components in FIG. 15 is omitted for the sake of brevity.

Furthermore, the memory device 200 according to at least this example embodiment may further include a monitoring unit 280.

The monitoring unit 280 may monitor whether a write operation is normally performed on a memory cell MC; that is, the monitoring unit 280 may monitor a result of a write operation. The monitoring unit 280 may monitor the write operation and transmit a result of monitoring to the pulse power controller 232.

If the write operation failed, then the pulse power controller 232 may access one of pulse power specs other than a previously selected pulse power spec, and transmit the accessed pulse power spec to the pulse power generating unit 260. This operation will be described in more detail below.

After a write operation is performed on a memory cell MC, verification may be performed to determine whether the write operation is normally performed. Pass/fail (P/F) information may be generated according to a result of the verification. The monitoring unit 280 may monitor the pass/fail (P/F) information, and provide the monitored pass/fail (P/F) information to the pulse power controller 232.

Characteristics of a resistance level distribution of the memory cell MC may be determined by referring to the pass/fail (P/F) information. For example, as characteristics of a memory cell MC, whether a resistance level distribution is changed in a direction in which resistance is increased or in a direction in which resistance is decreased may be determined.

The pulse power controller 232 may control a pulse power by referring to the pass/fail (P/F) information. That is, for example, a pulse power spec to be accessed to generate a pulse power may be varied according to a result of the monitoring.

For example, if a new pulse power spec is to be applied according to the pass/fail (P/F) information, then the pulse power controller 232 may access a pulse power spec that satisfies a previous memory cell coefficient C but has a different voltage level and a different pulse width so that a pulse power according to the pulse power spec is generated.

According to at least some other example embodiments, if a new pulse power spec is to be applied according to the pass/fail (P/F) information, then the pulse power controller 232 may access a pulse power spec that satisfies a memory cell coefficient C and that is different from a previous memory cell coefficient C so that a pulse power according to the pulse power spec is generated.

Figure 16:
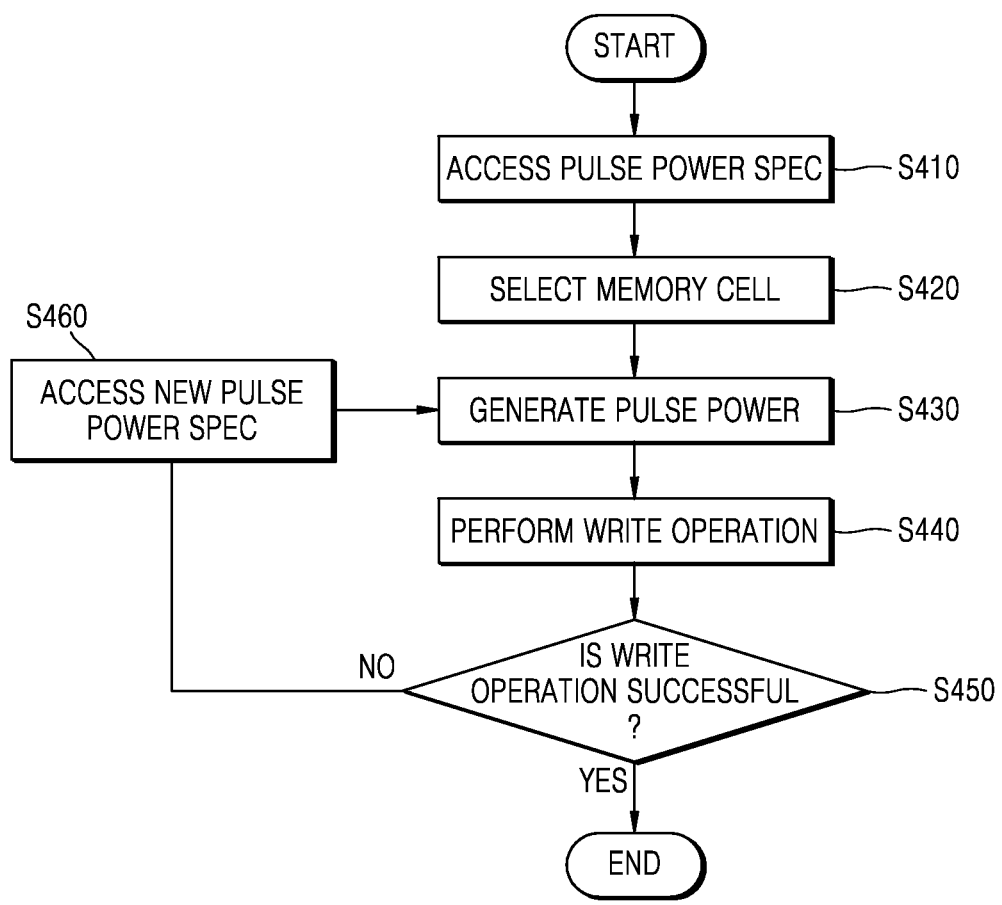
FIG. 16 is a flowchart illustrating a method of controlling a resistive memory device according to another example embodiment of inventive concepts.

FIG. 16 is a flowchart illustrating another example embodiment of a method of controlling a resistive memory device.

With regard to description with reference to FIG. 16, some of the elements illustrated in FIG. 15 may be referred to, and these elements will be described by referring to FIGS. 15 and 16 together.

Referring to FIG. 16, a method of performing a write operation may include accessing a pulse power spec (operation S410), selecting a memory cell (operation S420), generating a pulse power (operation S430), performing a write operation (operation S440), monitoring the write operation (S450), and accessing a new pulse power spec (operation S460).

The accessing a pulse power spec (operation S410), the selecting a memory cell (operation S420), the generating a pulse power (operation S430), and the performing a write operation (operation S440) may be the same or substantially the same as the accessing a pulse power spec (operation S110), the selecting a memory cell (operation S120), the generating a pulse power (operation S130), and the performing a write operation (operation S140), respectively. Thus, the description of FIG. 16 will focus on the monitoring a write operation (S450) and the accessing a new pulse power spec (operation S460).

In operation S450 of monitoring a write operation, the monitoring unit 280 may monitor whether a write operation for a memory cell MC is normally performed.

If the write operation failed, then operation S460 of accessing a new pulse power spec may be performed.

In operation S460, the pulse power controller 232 may access one of pulse power specs other than a previously selected pulse power spec from the storage unit 170, and transmit the pulse power spec to the pulse power generating unit 160. This will be described in more detail by referring to FIG. 15 together with FIG. 16.

In operation S410 of accessing a pulse power spec, when the pulse power controller 232 has accessed a first pulse power spec Sp1 from among pulse power specs Sp1 through Sp6 and transmitted the same to the pulse power generating unit 160, pulse power specs other than the first pulse power spec Sp1 (e.g., a third pulse power spec Sp3) may be accessed in operation S460 of accessing a new pulse power spec.

Later, the pulse power generating unit 160 may transmit a pulse power having the third pulse power spec Sp3 to the memory cell MC to perform a write operation.

As described above with reference to FIG. 6, even if the pulse power specs Sp1 through Sp6 have different voltage levels and different pulse widths from one another, the same or substantially the same write operation may be performed on the memory cell MC even when a pulse power having the third pulse power spec Sp3 is supplied to the memory cell MC because the pulse power specs Sp1 through Sp6 satisfy the same memory cell coefficient C.

As in this example embodiment, by monitoring a write operation performed on the memory cell MC, even if the write operation fails, a write operation may be performed more stably by transmitting another pulse power satisfying the same memory cell coefficient C to the memory cell MC.

Figure 17:
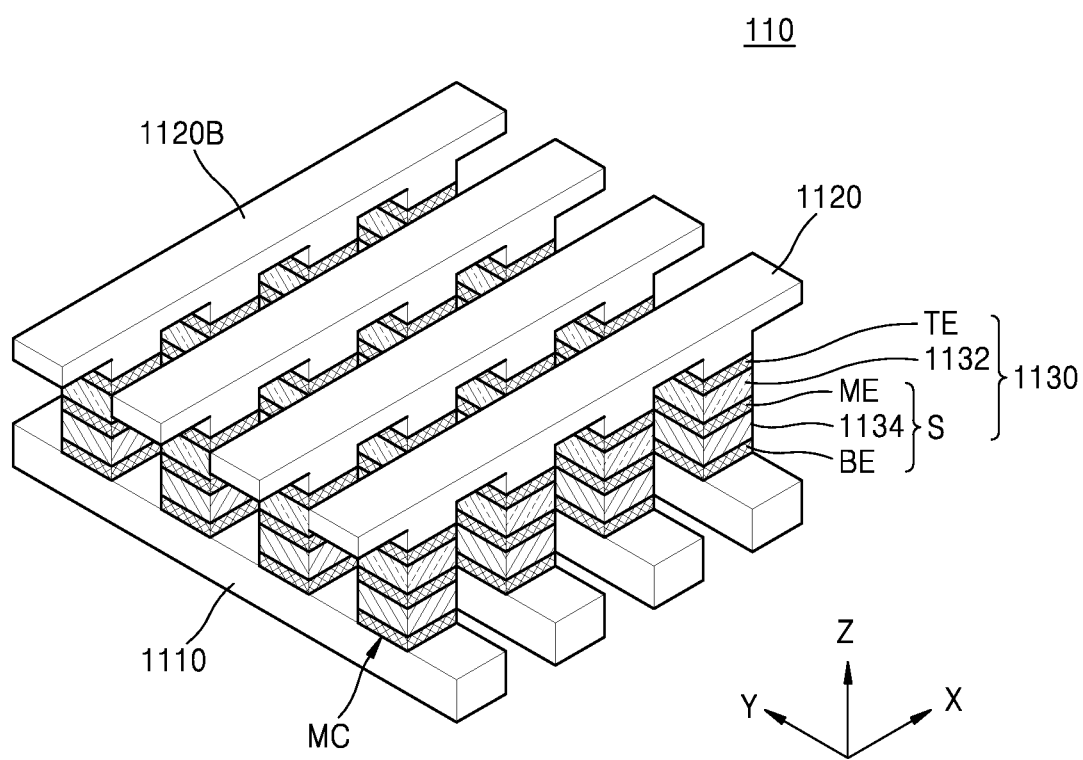
FIG. 17 is a perspective view an example embodiment of the memory cell array of FIG. 3.

FIG. 17 is a perspective view of the memory cell array 110 of FIG. 3 according to an example embodiment.

Referring to FIG. 17, the memory cell array 110 may include a plurality of first conductive lines 1110 extending in parallel or substantially parallel with one another in a first direction (e.g., X direction), and a plurality of second conductive lines 1120 extending in parallel or substantially parallel with one another in a second direction (e.g., Y direction) crossing the first direction.

According to at least this example embodiment, the X direction is illustrated as the first direction, and the Y direction is illustrated as the second direction. The first and second directions are orthogonal or substantially orthogonal to each other. However, inventive concepts are not limited to the directions illustrated in FIG. 17, so long as the first and second directions cross each other.

The plurality of first conductive lines 1110 and the plurality of second conductive lines 1120 may be a plurality of word lines or a plurality of bit lines, respectively. According to at least one example embodiment, the plurality of first conductive lines 1110 may be a plurality of word lines, and the plurality of second conductive lines 1120 may be a plurality of bit lines. In another example, the plurality of first conductive lines 1110 may be a plurality of bit lines, and the plurality of second conductive lines 1120 may be a plurality of word lines.

Each of the plurality of first conductive lines 1110 and each of the plurality of second conductive lines 1120 may be formed of, for example, a metal, a conductive metal nitride, a conductive metal oxide, or a combination of these. In at least some example embodiments, the first conductive lines 1110 and the second conductive lines 1120 may be formed of, for example, W, WN, Au, Ag, Cu, Al, TiAlN, Ir, Pt, Pd, Ru, Zr, Rh, Ni, Co, Cr, Sn, Zn, ITO, an alloy of these, a combination of these, or the like. In at least some other example embodiments, the first conductive lines 1110 and the second conductive lines 1120 may each include a metal layer and a conductive barrier layer covering at least a portion of the metal layer. The conductive barrier layer may be formed of, for example, Ti, TiN, Ta, TaN, a combination of these, or the like, but is not limited thereto.

The plurality of first conductive lines 1110 and the plurality of second conductive lines 1120 may be formed of a plurality of stripe patterns respectively crossing one another. A plurality of memory cells MC may be formed at respective points of intersection between the first conductive lines 1110 and the second conductive lines 1120, and a plurality of memory cells MC may form a cross point array structure.

Each of the plurality of memory cells MC may store digital information. The memory cells MC may store digital information according to a resistance change between various resistance states including a high resistance state (HRS) and a low resistance state (LRS). The plurality of memory cells MC may each include at least one material layer, and the materials layers of the plurality of memory cells MC may be different from one another.

The plurality of memory cells MC may be formed of a plurality of memory cell pillars 1130.

The memory cell pillars 1130 may each include a memory layer 1132 and a top electrode layer TE connected to the memory layer 1132.

The memory layer 1132 may include a resistance change layer whose resistance changes according to an electrical field. For example, if the memory layer 1132 includes a transition metal oxide, then the memory cell array 110 may be a RRAM. As another example, if the memory layer 1132 is formed of a phase change material whose resistance changes according to a temperature, then the memory cell array 110 may be a PRAM. As another example, if the memory layer 1132 has a magnetic tunnel junction (MTJ) structure including two electrodes formed of a magnetic body and a dielectric material interposed between the two magnetic body electrodes, then the memory cell array 110 may be a MRAM.

In at least some example embodiments, the memory layer 1132 may be formed of a compound of various forms. In some other example embodiments, the memory layer 1132 may be formed of a material formed by adding an impurity to a compound of various forms. In some other example embodiments, the memory layer 1132 may include a resistance change layer and at least one barrier layer and/or at least one conductive layer covering at least a portion of the resistance change layer.

If the memory layer 1132 is formed of a transition metal oxide, then the transition metal oxide may include at least one metal selected from the group including Ta, Zr, Ti, Hf, Mn, Y, Ni, Co, Zn, Nb, Cu, Fe, Cr, combinations thereof, or the like. For example, the transition metal oxide may be formed of a single layer or a multilayer structure formed of at least one material selected from the group including $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, $Fe_2O_{3-}$, combinations thereof, or the like. With regard to the described materials, x and y may be respectively in a range of $0 \leq x \leq 1.5$ and $0 \leq y \leq 0.5$, but are not limited thereto.

If the memory layer 1132 is formed of a phase change material whose resistance changes by Joule heat generated by a voltage applied to two ends of the memory layer 1132, then the phase change material may be $Ge_xSb_yTe_z$ (GST), N-doped GST, O-doped GST, $Ge_xTe_yO_x$, $Ge_xSb_y$, $In_xGe_yTe_z$, combinations thereof, or the like.

Also, if the memory layer 1132 has a MTJ structure, then the MTJ structure may include a magnetized fixed layer, a magnetized free layer, and a tunnel barrier interposed therebetween. The tunnel barrier may be formed of an oxide selected from Mg, Ti, Al, MgZn, MgB, combinations thereof, or the like, but is not limited thereto.

The top electrode layer TE may be formed of a metal, a conductive metal nitride, a conductive metal oxide, a combination of these, or the like. For example, the top electrode layer TE may include, for example, a TiN layer, but is not limited thereto. In at least some example embodiments, the top electrode layer TE may include a conductive layer formed of a metal or a conductive metal nitride and at least one conductive barrier layer covering at least a portion of the conductive layer. The conductive barrier layer may be formed of a metal oxide, a metal nitride, a combination of these, or the like, but is not limited thereto.

The plurality of memory cell pillars 1130 may each further include a selection device S. The selection device S may be a current adjusting device capable of controlling a flow of a current. In at least some example embodiments, the selection device S may be a unidirectional diode or a bidirectional diode, but is not limited thereto. The selection device S may be formed of a silicon-containing material, a transition metal oxide, chalcogenide glass, or the like. The selection device S may be a silicon diode, an oxide diode or a tunneling diode, but is not limited thereto.

The selection device S may include a selection device layer 1134, a middle electrode layer ME interposed between the selection device layer 1134 and the memory layer 1132, and a bottom electrode layer BE spaced apart from the middle electrode layer ME, where the selection device layer 1134 is included between the bottom electrode layer BE and the middle electrode layer ME.

In at least some example embodiments, the selection device S may be formed of a selection device having a metal/silicon/metal structure. For example, in the selection device S, the selection device layer 1134 may be formed of polysilicon, and the middle electrode layer ME and the bottom electrode layer BE may be each formed of TiN, but are not limited thereto.

In at least some example embodiments, the middle electrode layer ME and the bottom electrode layer BE may be each formed of a metal, a conductive metal nitride, a conductive metal oxide, a combination of these, or the like. For example, the middle electrode layer ME and the bottom electrode layer BE may each include a TiN layer, but are not limited thereto. In at least some example embodiments, the middle electrode layer ME and the bottom electrode layer BE may each include a conductive layer formed of a metal or a conductive metal nitride and at least one conductive barrier layer covering at least a portion of the conductive layer. The conductive barrier layer may be formed of a metal oxide, a metal nitride, a combination of these, or the like, but is not limited thereto.

The plurality of first conductive lines 1110, the plurality of second conductive lines 1120, and the plurality of memory cell pillars 1130 may be formed on a substrate (not shown).

A main surface of the substrate may be parallel, or substantially parallel, to a X-Y plane, and the memory cell pillars 1130 may extend on the substrate in a direction perpendicular, or substantially perpendicular, to the main surface of the substrate (Z direction).

The substrate may include a semiconductor wafer. In at least some example embodiments, the substrate may include a semiconductor element such as Si or Ge, or a compound semiconductor such as SiC, GaAs, InAs, or InP. In at least some other example embodiments, the substrate may have a silicon on insulator (SOI) structure. For example, the substrate may include a buried oxide layer (BOX). In at least some other example embodiments, the substrate may include a conductive region such as an impurity-doped well or an impurity-doped structure.

Although not illustrated, a structure including a plurality of gates, at least one interlayer insulation layer, a plurality of contacts, and a plurality of wirings may be interposed between the substrate and the first conductive lines 1110.

Figure 18:
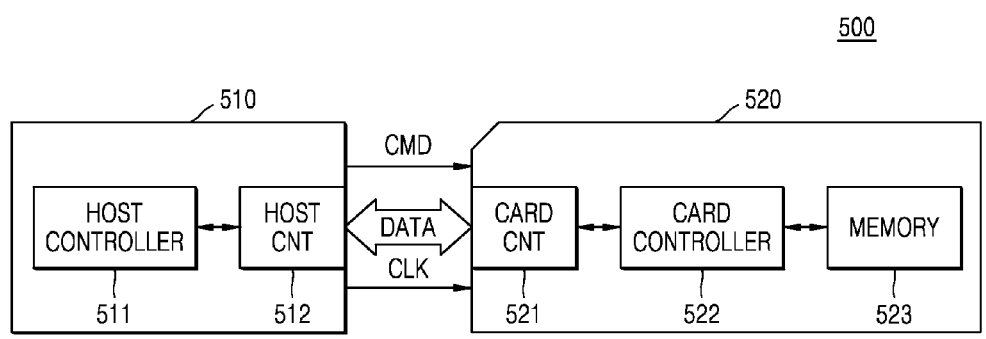
FIG. 18 is a block diagram illustrating a memory card system to which one or more memory systems according to example embodiments of inventive concepts may be applied.

FIG. 18 is a block diagram illustrating a memory card system 500 to which memory systems according to one or more example embodiments of inventive concepts may be applied.

Referring to FIG. 18, the memory card system 500 may include a host 510 and a memory card 520. The host 510 may include a host controller 511 and a host connector 512. The memory card 520 may include a card connector 521, a card controller 522, and a memory device 523. Here, the memory device 523 may be implemented according to the example embodiments shown in one or more of FIGS. 1 through 17, and accordingly, the memory device 523 may include a pulse power generating unit and a pulse power controller. The pulse power controller may determine a voltage level and a pulse width of a pulse power generated by using the pulse power generating unit, and may more stably perform a write operation despite parasitic impedance that may be present in a memory cell array. Also, the pulse power controller may form a MLC by determining a voltage level and a pulse width of a pulse power such that the pulse power has various memory cell coefficients.

The host 510 may write data to the memory card 520 or may read data stored in the memory card 520. The host controller 511 may transmit a command CMD, a clock signal CLK generated by a clock generator (not shown) in the host 510, and data DATA to the memory card 520 via the host connector 512.

In response to the command CMD received via the card connector 521, the card controller 522 may store the data DATA in the memory device 523, in synchronization with a clock signal that is generated by a clock generator (not shown) in the card controller 522. The memory device 523 may store the data DATA that is transmitted from the host 510.

The memory card 520 may be implemented as a compact flash card (CFC), a Microdrive, a smart media card (SMC), a multimedia card (MMC), a security digital card (SDC), a memory stick, or a universal serial bus (USB) flash memory drive.

Figure 19:
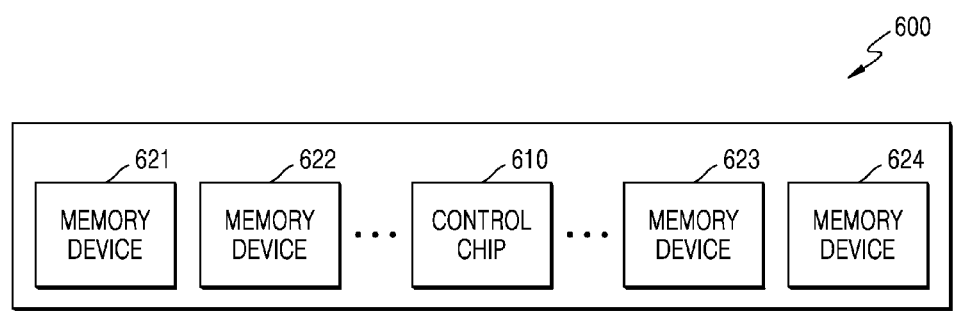
FIG. 19 illustrates a resistive memory module according to an example embodiment of inventive concepts.

FIG. 19 illustrates a resistive memory module 600 according to an example embodiment of inventive concepts.

Referring to FIG. 19, the memory module 600 may include memory devices 621 through 624 and a control chip 610.

At least one of the memory devices 621 through 624 may be implemented using one or more of the example embodiments illustrated in FIGS. 1 through 17.

The control chip 610 may control the memory devices 621 through 624 in response to various signals transmitted from an external memory controller. For example, the control chip 610 may activate the memory devices 621 through 624 according to various commands and addresses, to which the memory device 621 and 624 respectively correspond, transmitted from the outside. Also, the control chip 610 may perform various post-processing on read data output from each of the memory devices 621 through 624, and may perform, for example, error detection and correction operations on read data.

Figure 20:
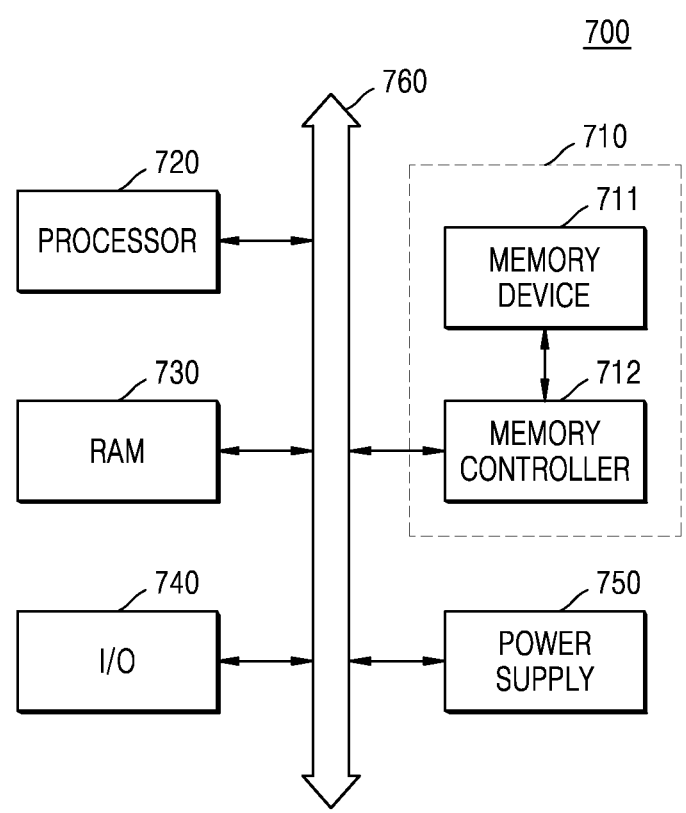
FIG. 20 is a block diagram illustrating a computing system including a memory system according to an example embodiment of inventive concepts.

FIG. 20 is a block diagram illustrating a computing system 700 including a memory system 710, according to an example embodiment of inventive concepts.

Referring to FIG. 20, the computing system 700 may include the memory system 710, a processor 720, a RAM 730, an input/output (I/O) device 740, and a power supply device 750. The memory system 710 may also include a memory device 711 and a memory controller 712.

Although not illustrated in FIG. 20, the computing system 700 may further include ports capable of communicating with a video card, a sound card, a memory card, a USB device, or other electronic devices. The computing system 700 may be embodied as a personal computer (PC), or a portable electronic device such as a notebook computer, a mobile phone, a personal digital assistant (PDA), a camera, etc.

The processor 720 may perform particular calculations or tasks. In one or more example embodiments, the processor 720 may be a micro-processor, a Central Processing Unit (CPU), or the like. The processor 720 may perform communication with the RAM 730, the I/O device 740, and the memory system 710 via a bus 760 such as an address bus, a control bus, or a data bus. Here, the memory system 710 and/or the RAM 730 may be implemented using one or more example embodiments shown in FIGS. 1 through 17.

According to at least one example embodiment, the processor 720 may also be connected to an extended bus such as a Peripheral Component Interconnect (PCI) bus.

The RAM 730 may store data for operations of the computing system 700. As described above, the memory device according to the one or more example embodiments of inventive concepts may be applied to the RAM 730. Alternatively, a DRAM, a mobile DRAM, an SRAM, a PRAM, an FRAM, an MRAM, etc., may be used as the RAM 730.

The I/O device 740 may include an input unit such as a keyboard, a keypad, or a mouse, and an output unit such as a printer or a display. The power supply device 750 may supply an operating voltage for the operations of the computing system 700.

As discussed herein, the components/elements referred to as controllers or units (e.g., control logic unit, pulse power generating unit, pulse power controller, storage unit, monitoring unit, host controller, card controller, etc.) may also be referred to as circuits (e.g., control logic circuit, pulse power generating circuit, pulse power control circuit, storage circuit, monitoring circuit, host control circuit, card control circuit, etc.) and may include the necessary hardware for performing the functions associated with example embodiments discussed herein While inventive concepts have been shown and described with reference to some example embodiments thereof, it will be understood that various changes in form and details may be made therein without departing from the spirit and scope of the following claims.

What is claimed is:

1. A method of controlling a resistive memory device, the method comprising:
   accessing a first pulse power specification satisfying a memory cell coefficient associated with at least a first of a plurality of memory cells included in a memory cell array;
   generating a first pulse power according to the accessed first pulse power specification; and
   performing a write operation on at least the first of the plurality of memory cells using the generated first pulse power; wherein
      a second of the plurality of memory cells has a different memory cell coefficient relative to the first of the plurality of memory cells, and
      the performing the write operation includes performing the write operation on the first of the plurality of memory cells and the second of the plurality of memory cells by using pulse powers corresponding to different memory cell coefficients.

2. The method of claim 1, further comprising:
   monitoring a result of the write operation;
   accessing a second pulse power specification satisfying the memory cell coefficient based on a result of the monitoring; and
   generating a second pulse power according to the accessed second pulse power specification, the generated second pulse power having a different voltage level and a different pulse width relative to the generated first pulse power.

3. The method of claim 1, wherein the memory cell coefficient has a value based on at least one of a material and a structure of the plurality of memory cells.

4. The method of claim 1, further comprising:
   setting at least one of a voltage level and a pulse width of the generated first pulse power according to the accessed first pulse power specification.

5. The method of claim 4, wherein the memory cell coefficient satisfies the equation $$(V-Vos)^2 \times PW = C,$$

where V denotes a voltage level of the generated first pulse power, Vos denotes an offset voltage level, PW denotes a pulse width of the generated first pulse power, and C denotes the memory cell coefficient.

6. The method of claim 5, wherein the performing the write operation comprises:
   applying the generated first pulse power having the set voltage level and the set pulse width to each of the plurality of memory cells to perform the same write operation on each of the plurality of memory cells.

7. The method of claim 5, wherein the set voltage level of the generated first pulse power is greater than the offset voltage level.

8. The method of claim 4, wherein if the set voltage level of the generated first pulse power is a maximum possible voltage level, then the setting of the pulse width of the first pulse power includes
   determining a pulse width satisfying the memory cell coefficient based on the maximum possible voltage level.

9. The method of claim 4, wherein if the set pulse width of the generated first pulse power is a maximum possible pulse width, then the setting of the voltage level of the first pulse power includes
   determining a voltage level satisfying the memory cell coefficient based on the maximum possible pulse width.

10. The method of claim 5, wherein
    when the voltage level of the generated first pulse power is smaller than the offset voltage level, a read operation is performed.

11. The method of claim 1, further comprising:
    storing, in the resistive memory device, a plurality of pulse power specifications satisfying the memory cell coefficient, which is calculated by performing a test operation.

12. The method of claim 1, wherein the write operation is a set write operation in which a resistance state of at least the first of the plurality of memory cells is reduced.

13. A method of controlling a resistive memory device, the method comprising:
    setting a voltage level and a pulse width of a pulse power such that the pulse power satisfies a memory cell coefficient, the memory cell coefficient being based on characteristics of a plurality of memory cells of a memory cell array;
    generating the pulse power having the set voltage level and the set pulse width in response to a write command; and performing a write operation on the plurality of memory cells by using the generated pulse power, the write operation corresponding to the write command.

14. The method of claim 13, wherein the plurality of memory cells are multilevel cells, and the method further includes
receiving information indicating which of a plurality of write operations is to be performed on the multilevel cells; and
accessing the memory cell coefficient from among a plurality of memory cell coefficients associated with the multilevel cells, the memory cell coefficient being associated with the write operation corresponding to the received information.

15. The method of claim 14, further comprising:
storing a plurality of pulse power specifications satisfying the memory cell coefficient in the resistive memory device; and
wherein the set voltage level and the set pulse width of the pulse power are set according to a pulse power specification selected from among the plurality of pulse power specifications.

16. A method of programming at least one memory cell of a resistive memory device, the method comprising:
selecting a first pulse power specification from among a plurality of pulse power specifications based on a memory cell coefficient for the at least one memory cell, each of the plurality of pulse power specifications corresponding to a write operation for the at least one memory cell;
setting a voltage level and a pulse width for performing the write operation on the at least one memory cell based the selected first pulse power specification; and
performing the write operation on the at least one memory cell using the set voltage level and pulse width.

17. The method of claim 16, further comprising:
detecting a failure of the write operation;
selecting a second pulse power specification from among the plurality of pulse power specifications corresponding to the write operation;
re-setting the voltage level and the pulse width for performing the write operation on the at least one memory cell based the selected second pulse power specification; and
re-performing the write operation using the re-set voltage level and pulse width.

18. The method of claim 16, wherein
the at least one memory cell is a multilevel cell having a plurality of resistance states, each of the plurality of resistance states having an associated memory cell coefficient; and
the selecting selects the first pulse power specification based on the memory cell coefficient associated with a resistance state, from among the plurality of resistance states, corresponding to the write operation.

19. The method of claim 16, wherein each of the plurality of pulse width specifications satisfies the memory cell coefficient.

20. The method of claim 16, wherein the selecting selects the first pulse power specification based on one of a maximum voltage level and a maximum pulse width capability of the resistive memory device.

* * * * *